US008080994B2

(12) United States Patent
Taylor et al.

(10) Patent No.: US 8,080,994 B2
(45) Date of Patent: Dec. 20, 2011

(54) INTEGRATED CURRENT SENSOR

(75) Inventors: William P. Taylor, Amherst, NH (US);
Michael C. Doogue, Manchester, NH (US); John Cummings, Londonderry, NH (US); Vijay Mangtani, Nashua, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

(21) Appl. No.: 12/261,629

(22) Filed: Oct. 30, 2008

(65) Prior Publication Data
US 2009/0058412 A1 Mar. 5, 2009

Related U.S. Application Data

(63) Continuation of application No. 11/776,242, filed on Jul. 11, 2007, now abandoned, which is a continuation-in-part of application No. 11/383,021, filed on May 12, 2006, now abandoned.

(51) Int. Cl.
G01R 33/02 (2006.01)
(52) U.S. Cl. ........................................ 324/252
(58) Field of Classification Search .................. None
See application file for complete search history.

(56) References Cited

U.S. PATENT DOCUMENTS

| 4,425,596 | A | 1/1984 | Satou |
|---|---|---|---|
| 4,893,073 | A | 1/1990 | McDonald et al. |
| 5,041,780 | A * | 8/1991 | Rippel ................ 324/117 H |
| 5,124,642 | A | 6/1992 | Marx |
| 5,247,202 | A | 9/1993 | Popovic et al. |
| 5,442,228 | A | 8/1995 | Pham et al. |
| 5,561,366 | A | 10/1996 | Takahashi et al. |
| 5,615,075 | A | 3/1997 | Kim |
| 6,005,383 | A | 12/1999 | Savary et al. |
| 6,150,714 | A * | 11/2000 | Andreycak et al. .......... 257/690 |
| 6,252,389 | B1 | 6/2001 | Baba et al. |
| 6,316,931 | B1 | 11/2001 | Nakagawa et al. |
| 6,323,634 | B1 | 11/2001 | Nakagawa et al. |
| 6,356,068 | B1 | 3/2002 | Steiner et al. |
| 6,411,078 | B1 | 6/2002 | Nakagawa et al. |
| 6,424,018 | B1 | 7/2002 | Ohtsuka |
| 6,445,171 | B2 | 9/2002 | Sandquist et al. |
| 6,462,531 | B1 * | 10/2002 | Ohtsuka .................. 324/117 H |
| 6,545,456 | B1 | 4/2003 | Radosevich et al. |
| 6,566,856 | B2 | 5/2003 | Sandquist et al. |
| 6,583,572 | B2 * | 6/2003 | Veltrop et al. ........... 315/111.51 |

(Continued)

FOREIGN PATENT DOCUMENTS

DE 4 141 386 A1 6/1993

(Continued)

OTHER PUBLICATIONS

File downloaded for U.S. Appl. No. 11/383,021, filed May 12, 2006, Image File Wrapper through Jan. 15, 2009, Part 1 of 2, 315 pages.

(Continued)

Primary Examiner — Jermele M Hollington
(74) Attorney, Agent, or Firm — Daly, Crowley, Mofford & Durkee, LLP

(57) ABSTRACT

An integrated current sensor includes a current conductor, a magnetic field transducer, and an electromagnetic shield. The magnetic field transducer includes a sensor die. The electromagnetic shield is disposed proximate to the sensor die. The electromagnetic shield has at least one feature selected to reduce an eddy current in the electromagnetic shield.

36 Claims, 14 Drawing Sheets

U.S. PATENT DOCUMENTS

| | | | |
|---|---|---|---|
| 6,642,705 B2 | 11/2003 | Kawase | |
| 6,667,682 B2 | 12/2003 | Wan et al. | |
| 6,683,448 B1 | 1/2004 | Ohtsuka | |
| 6,727,683 B2 | 4/2004 | Goto et al. | |
| 6,759,841 B2 | 7/2004 | Goto et al. | |
| 6,781,359 B2* | 8/2004 | Stauth et al. | 324/117 H |
| 6,791,313 B2 | 9/2004 | Ohtsuka | |
| 6,796,485 B2* | 9/2004 | Seidler | 315/85 |
| 6,812,687 B1 | 11/2004 | Ohtsuka | |
| 6,841,989 B2* | 1/2005 | Goto et al. | 324/117 H |
| 6,853,178 B2 | 2/2005 | Hayat-Dawoodi | |
| 6,867,573 B1 | 3/2005 | Carper | |
| 6,921,955 B2 | 7/2005 | Goto et al. | |
| 6,989,665 B2 | 1/2006 | Goto et al. | |
| 6,995,315 B2* | 2/2006 | Sharma et al. | 324/117 H |
| 7,006,749 B2 | 2/2006 | Illich et al. | |
| 7,075,287 B1* | 7/2006 | Mangtani et al. | 324/117 H |
| 7,129,691 B2* | 10/2006 | Shibahara et al. | 324/117 H |
| 7,166,807 B2* | 1/2007 | Gagnon et al. | 324/117 H |
| 7,248,045 B2 | 7/2007 | Shoji | |
| 7,259,545 B2* | 8/2007 | Stauth et al. | 324/117 R |
| 7,348,724 B2 | 4/2008 | Taylor et al. | |
| 7,476,816 B2* | 1/2009 | Doogue et al. | 324/117 H |
| 7,557,563 B2* | 7/2009 | Gunn et al. | 324/127 |
| 7,598,601 B2* | 10/2009 | Taylor et al. | 324/117 H |
| 7,816,905 B2* | 10/2010 | Doogue et al. | 324/117 H |
| 2001/0028115 A1 | 10/2001 | Yanagawa et al. | |
| 2002/0179987 A1 | 12/2002 | Meyer et al. | |
| 2003/0039062 A1* | 2/2003 | Takahasahi | 360/112 |
| 2005/0045359 A1 | 3/2005 | Doogue et al. | |
| 2005/0230843 A1 | 10/2005 | Williams | |
| 2006/0002147 A1 | 1/2006 | Hong et al. | |
| 2006/0071655 A1 | 4/2006 | Shoji | |
| 2006/0091993 A1 | 5/2006 | Shoji | |
| 2006/0114098 A1 | 6/2006 | Shoji | |
| 2006/0145690 A1 | 7/2006 | Shoji | |
| 2006/0152210 A1* | 7/2006 | Mangtani et al. | 324/117 H |
| 2006/0170529 A1 | 8/2006 | Shoji | |
| 2006/0181263 A1* | 8/2006 | Doogue et al. | 324/117 H |
| 2006/0219436 A1* | 10/2006 | Taylor et al. | 174/529 |
| 2006/0291106 A1 | 12/2006 | Shoji | |
| 2007/0044370 A1 | 3/2007 | Shoji | |
| 2007/0076332 A1 | 4/2007 | Shoji | |
| 2007/0090825 A1 | 4/2007 | Shoji | |
| 2007/0096716 A1 | 5/2007 | Shoji | |
| 2007/0188946 A1 | 8/2007 | Shoji | |
| 2007/0279053 A1* | 12/2007 | Taylor et al. | 324/252 |
| 2008/0297138 A1 | 12/2008 | Taylor et al. | |
| 2009/0121704 A1* | 5/2009 | Shibahara | 324/117 R |
| 2010/0237450 A1* | 9/2010 | Doogue et al. | 257/427 |

FOREIGN PATENT DOCUMENTS

| | | |
|---|---|---|
| DE | 4 141 386 C2 | 6/1993 |
| EP | 0 867 725 A1 | 9/1998 |
| EP | 1 107 327 A2 | 6/2001 |
| EP | 1 107 328 A2 | 6/2001 |
| EP | 1 111 693 A2 | 6/2001 |
| EP | 1 180 804 A2 | 2/2002 |
| EP | 1281974 A2 | 2/2003 |
| GB | 2273782 A * | 6/1994 |
| JP | 61-71649 | 4/1986 |
| JP | 63-191069 | 8/1988 |
| JP | 04-364472 | 12/1992 |
| JP | 2000174357 | 6/2000 |
| JP | 2001165963 | 6/2001 |
| JP | 2001174486 | 6/2001 |
| JP | 2001221815 | 8/2001 |
| JP | 2001230467 | 8/2001 |
| JP | 2001339109 | 12/2001 |
| JP | 2002026419 | 1/2002 |
| JP | 2002040058 | 2/2002 |
| JP | 2002202326 | 7/2002 |
| JP | 2002202327 | 7/2002 |
| WO | WO 99/14605 | 3/1999 |
| WO | WO 2005/026749 A1 | 3/2005 |
| WO | WO 2006/130393 | 12/2006 |

OTHER PUBLICATIONS

File downloaded for U.S. Appl. No. 11/383,021, filed May 12, 2006, Image File Wrapper through Jan. 15, 2009, Part 2 of 2, 1-293 pages.
File downloaded for U.S. Appl. No. 11/776,242, filed Jul. 11, 2007, Image File Wrapper through Feb. 9, 2009, 540 pages.
Chinese Office Action for Chinese National Stage Application No. CN 2004 80024296.5 dated Apr. 29, 2009 (PCT/US2004/009908).
Chinese Office Action for Chinese National Stage Application No. CN 2004 80024296.5 dated Sep. 26, 2008 (PCT/US2004/009908).
Chinese Office Action for Chinese National Stage Application No. CN 2004 80024296.5 dated May 6, 2008 (PCT/US2004/009908).
Chinese Office Action for Chinese National Stage Application No. CN 2004 80024296.5 dated Nov. 23, 2007 (PCT/US2004/009908).
European Office Action for European National Stage Application No. EP 04816162.4 dated Jan. 2, 2008 (PCT/US2004/009908).
European Office Action for European National Stage Application No. EP 04816162.4 dated Jun. 27, 2007 (PCT/US2004/009908).
Japanese Final Office Action for Japanese National Stage Application No. JP 2006-524610 dated Apr. 23, 2009 (PCT/US2004/009908).
Japanese Office Action for Japanese National Stage Application No. JP 2006-524610 dated Sep. 10, 2008 (PCT/US2004/009908).
Japanese Office Action for Japanese National Stage Application No. JP 2006-524610 dated Jul. 10, 2008 (PCT/US2004/009908).
EP Office Action dated Jun. 17, 2009; for EP Pat. App. No. 048163162.4.
Lee et al.; "Fine Pitch Au-SnAgCu Joint-in-via Flip-Chip Packaging;" IEEE $9^{th}$ Electronics Packaging Technology Conference, Dec. 10-12, 2007; pp. 1-7.
EP Search Report of the EPO for EP09000121.5 dated Feb. 10, 2010.
EP Search Report of the EPO for EP09000123.1 dated Jan. 22, 2010.
Clemson University Vehicular Electronics Laboratory; "Electromagnetic Compatibility;" inet: http://www.cvel.clemson.edu/emc/tutorials/Shielding02/Practical_Shielding.html; Jan. 7, 2010; 9 sheets.
Wikipedia; "Electromagnetic Field;" inet: http://en.wikipedia.orp/wiki/Electromagnetic_field; Jan. 7, 2010; 7 sheets.
Wikipedia; "Electromagnetic Shielding;" inet: http://en.wikipedia.org/wiki/Electromagnetic_shielding; Jan. 7, 2010; 3 sheets.
Wikipedia; "Magnetic Field;" inet: http://en.wikipedia.org/wiki/Magnetic_field; Jan. 7, 2010; 25 sheets.
Japanese Office Action dated Sep. 21, 2010 for JP2008-513632; English Translation; 2 pages.
Korean Response to Office Action dated Jul. 22, 2010 for KR 10-2006-7002842; English Translation; 11 pages.
Korean Amendment to Office Action dated Jul. 22, 2010 for KR 10-2006-7002842; English Translation; 7 pages.
Korean Office Action (with English translation) dated Jul. 22, 2010 for KR App. No. 10-2006-7002842.
EP Search Report of the EPO for EP10183958.7 dated Feb. 4, 2011.
EP Office Action dated Feb. 23, 2011 for EP 09 000 121.5.
Japanese Office Action dated May 16, 2011 for JP Pat. App. No. 2009-151851; 1 sheets.
Japanese Office Action dated May 19, 2011 for JP Pat. App. No. 2010-281774; 2 sheets.
Japanese Office Action dated May 19, 2011 for JP Pat. App. No. 2010-281804; 2 sheets.
Japanese Office Action dated May 19, 2011 for JP Pat. App. No. 2010-281828; 2 sheets.
Japanese Office Action dated May 19, 2011 for JP Pat. App. No. 2008-513632; 2 sheets.
Japanese Office Action dated May 19, 2011 for JP Pat. App. No. 2010-281841; 2 sheets.
PCT Search Report and Written Opinion of the ISA for PCT/US2004/009908 dated Aug. 16, 2004.
PCT Search Report and Written Opinion of the ISA for PCT/US2006/019953 dated Sep. 25, 2006.
Mosbarger et al.; "The Effects of Materials and Post-Mold Profiles on Plastic Encapsulated Integrated Circuits;" IEEE/IRPS; Apr. 1994; pp. 93-100.
Steiner, et al.; "Fully Packaged CMOS Current Monitor Using Lead-on-Chip Technology;" Physical Electronics Laboratory, ETH Zurich, CH8093 Zurich, Switzerland; No. 0-7803-4412-X/98; IEEE 1998; pp. 603-608.

Taylor et al.; "Current Sensor;" U.S. Appl. No. 12/171,651, filed Jul. 11, 2008.

Letter to Yuasa and Hara including a First Set of Draft Claim Amendments For Consideration and a Second Set of Draft Claim Amendments for Consideration; dated Jul. 18, 2011; for JP Pat. App. No. 2008-513632; 14 pages.

Letter from Yuasa and Hara including a response as filed on Aug. 18, 2011 for JP Pat. App. No. 2008-513632; 9 pages.

EP Official Communication; dated May 16, 2008; for EP Pat. App. No. 06 770 974.1-2216; 4 pages.

Response to EP Official Communication; dated Nov. 26, 2008; for EP Pat. App. No. 06 770 974.1; 44 pages.

EPC Communication under Rule 71(e); dated Apr. 27, 2009; for EP Pat. App. No. 06 770 974.1-2216; 6 pages.

PCT International Preliminary Report on Patentability and Written Opinion of the ISA; dated Dec. 13, 2007; for PCT Pat. App. PCT/US2006/019953; 7 pages.

U.S. Office Action dated Nov. 26, 2007; for U.S. Appl. No. 11/383,021; 19 pages.

U.S. Response to Office Action dated Nov. 26, 2007; and filed on Feb. 26, 2008; for U.S. Appl. No. 11/383,021; 14 pages.

U.S. Notice of Allowance dated Jun. 4, 2008; for U.S. Appl. No. 11/383,021; 9 pages.

Image File Wrapper covering Jun. 15, 2009 through Sep. 16, 2011; for U.S. Appl. No. 11/383,021; 12 pages.

U.S. Notice of Allowance dated Jun. 10, 2009; for U.S. Appl. No. 12/171,651, now U.S. Pat. No. 7,598,601; 16 pages.

Image File Wrapper downloaded Sep. 16, 2011; for U.S. Appl. No. 12/171,651, now U.S. Pat. No. 7,598,601; Part 1 of 8; 320 pages.

Image File Wrapper downloaded Sep. 16, 2011; for U.S. Appl. No. 12/171,651, now U.S. Pat. No. 7,598,601; Part 2 of 8; 320 pages.

Image File Wrapper downloaded Sep. 16, 2011; for U.S. Appl. No. 12/171,651, now U.S. Pat. No. 7,598,601; Part 3 of 8; 320 pages.

Image File Wrapper downloaded Sep. 16, 2011; for U.S. Appl. No. 12/171,651, now U.S. Pat. No. 7,598,601; Part 4 of 8; 320 pages.

Image File Wrapper downloaded Sep. 16, 2011; for U.S. Appl. No. 12/171,651, now U.S. Pat. No. 7,598,601; Part 5 of 8; 320 pages.

Image File Wrapper downloaded Sep. 16, 2011; for U.S. Appl. No. 12/171,651, now U.S. Pat. No. 7,598,601; Part 6 of 8; 320 pages.

Image File Wrapper downloaded Sep. 16, 2011; for U.S. Appl. No. 12/171,651, now U.S. Pat. No. 7,598,601; Part 7 of 8; 320 pages.

Image File Wrapper downloaded Sep. 16, 2011; for U.S. Appl. No. 12/171,651, now U.S. Pat. No. 7,598,601; Part 8 of 8; 217 pages.

* cited by examiner

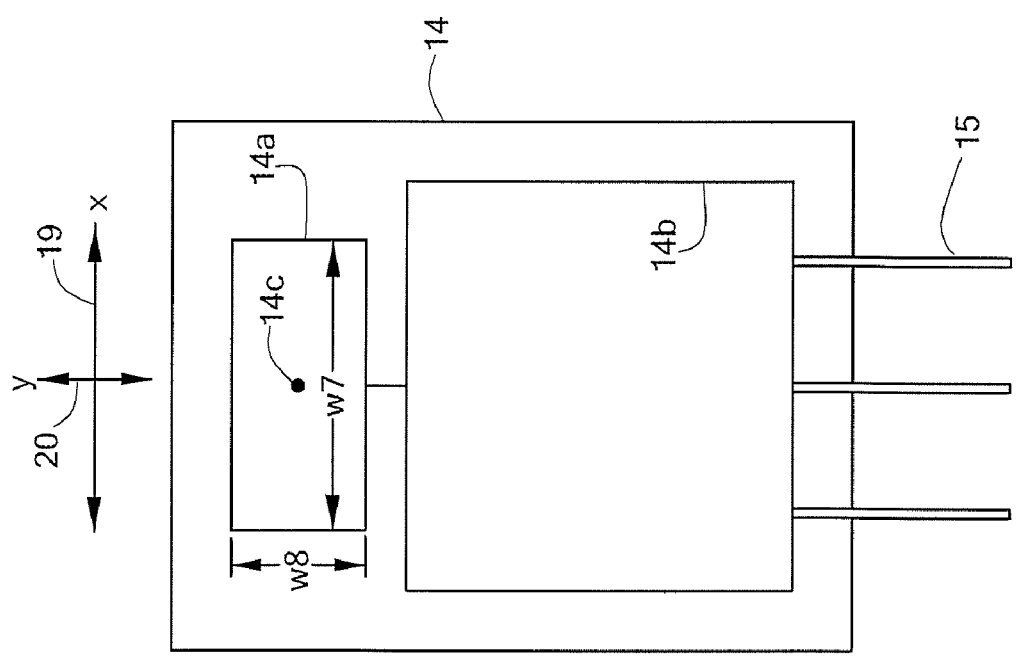
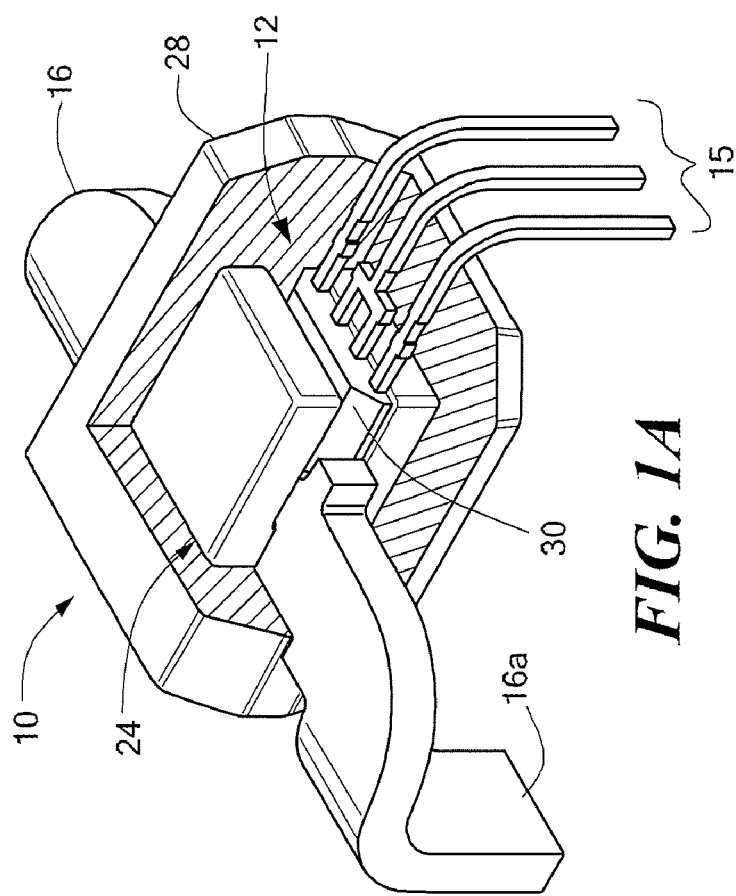
FIG. 1B
FIG. 1A

US 8,080,994 B2

INTEGRATED CURRENT SENSOR

CROSS REFERENCE TO RELATED APPLICATIONS

This application is a Continuation application of and claims the benefit under 35 U.S.C. §120 of U.S. application Ser. No. 11,776 242 filed Jul. 11, 2007 now abandoned, which application is a Continuation-in-Part application of and claims the benefit under 35 §120 of U.S. patent application Ser. No. 11/383,021 filed May 12, 2006 now abandoned.

STATEMENT REGARDING FEDERALLY SPONSORED RESEARCH

Not Applicable.

FIELD OF THE INVENTION

This invention relates generally to electrical current sensors, and more particularly to a miniaturized current sensor having an integrated conductor.

BACKGROUND OF THE INVENTION

As is known in the art, one type of conventional electrical current sensor uses a Hall effect magnetic field transducer in proximity to a current-carrying conductor. The Hall effect device generates an output signal having a magnitude proportional to the magnetic field induced by the current through the conductor. Typical current sensors of this type include a gapped toroid magnetic flux concentrator, with the Hall effect device positioned in the toroid gap. The Hall effect device and toroid are assembled in a housing, which is mountable on a printed circuit board. In use, a separate current-carrying conductor, such as a wire, is passed through the center of the toroid and is soldered to the printed circuit board, such as by soldering exposed ends of the wire to plated through-holes. Such devices tend to be undesirably large, both in terms of height and circuit board area.

Various parameters characterize the performance of Hall effect devices in current sensing applications, including sensitivity, which is the change in the output signal of the Hall effect device in response to a one ampere change through the conductor, and linearity, which is the degree to which the output signal varies in direct proportion to the current through the conductor. Important considerations in the use of Hall effect devices include the effect of stray magnetic fields and external magnetic noise on the device performance. Another important consideration is the effect of electromagnetic noise upon the device performance.

It has also been found, in general, that accumulated charge can form at an interface between an integrated circuit encapsulation (e.g., plastic) and the substrate (sensor die) of the integrated circuit. This trapped charge tends to cause undesirable effects, for example "gate leakage" from the substrate of the integrated circuit, resulting in out-of-specification behavior of the integrated circuit. The "gate leakage" can be caused by a forward biased enhancement mode parasitic field effect transistor (FET), which forms due to accumulated charge over a floating epi-material pocket in the substrate of the integrated circuit.

SUMMARY OF THE INVENTION

In accordance with one aspect of the present invention, a current sensor includes a current conductor for passing a current sensed by the current sensor. The current sensor also includes a magnetic field transducer proximate to the current conductor. The magnetic field transducer includes a sensor die with first and second opposing surfaces. The sensor die also has an end surface coupling the first and second opposing surfaces. The first surface of the sensor die supports a magnetic field sensing element. The current sensor also includes an electromagnetic shield proximate to the first surface of the sensor die. The electromagnetic shield has at least one feature selected to reduce an eddy current induced in the electromagnetic shield.

With the above-described arrangement, the electromagnetic shield reduces the influence of electromagnetic noise upon the current sensor. The at least one feature of the shield tends to reduce the reduction of the magnetic field, which reduction would otherwise be caused by eddy currents in the electromagnetic shield, and which eddy currents would otherwise result in the current sensor having less sensitivity. Furthermore, the shield tends to reduce the effect of trapped charge at an interface between an encapsulation (e.g., plastic) over the sensor die and a surface of the sensor die.

In accordance with another aspect of the present invention, a current sensor includes a current conductor for carrying a current sensed by the current sensor. The current sensor also includes a magnetic field transducer proximate to said current conductor. The magnetic field transducer has a sensor die with first and second opposing surfaces and an end surface coupling the first and second opposing surfaces. The first surface of the sensor die supports a magnetic field sensing element. The current sensor also includes an electromagnetic shield proximate to the first surface of the sensor die. The current sensor also includes a magnetic core having a central region and a pair of substantially parallel legs extending from the central region. The pair of legs straddles the current conductor with at least a portion of each leg covering at least a portion of a respective surface of the magnetic field sensing element.

BRIEF DESCRIPTION OF THE DRAWINGS

The foregoing features of the invention, as well as the invention itself may be more fully understood from the following detailed description of the drawings, in which:

FIG. 1A is an isometric view of the assembled current sensor of FIG. 1;

FIG. 1B is a plan view of a sensor die of the Hall effect sensor of FIG. 1A;

DETAILED DESCRIPTION OF THE INVENTION

Figure 1:
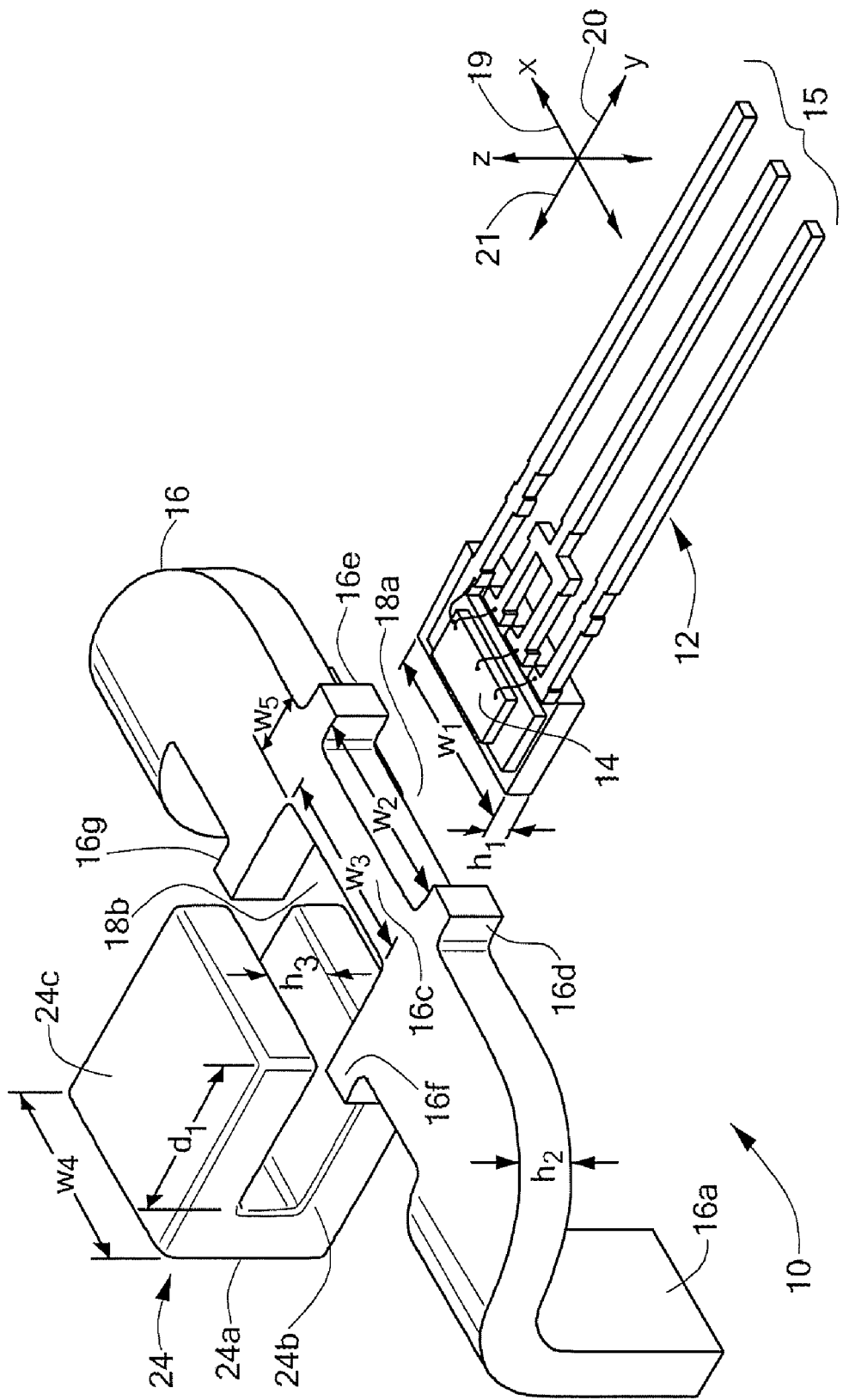
FIG. 1 is an exploded isometric view of a current sensor in accordance with the present invention.

Referring to FIG. 1, a miniaturized, integrated current sensor 10 includes a magnetic field transducer, here in the form of Hall effect sensor 12, a current-carrying conductor 16 and a magnetic core 24. The conductor 16 includes features for receiving portions of the Hall effect sensor 12 and the magnetic core 24 such that the elements are maintained in a fixed position relative to each other. In the illustrated embodiment, the conductor 16 has a first notch 18a and a second notch 18b substantially aligned with the first notch. In assembly, at least a portion of the Hall effect sensor 12 is disposed in the first notch 18a. The magnetic core 24 is substantially C-shaped and has a central region 24a and a pair of substantially parallel legs 24b, 24c extending from the central region. In assembly, at least a portion of the central region 24a is disposed in the second notch 18b of the conductor such that each leg 24b, 24c covers at least a portion of a respective surface of the Hall effect sensor 12.

The Hall effect sensor 12 is provided in the form of an integrated circuit containing a sensor die 14 encapsulated with an electrically insulating material. The integrated Hall effect sensor 12 can be provided in different package types, such as the "K" single in line (SIP) package having a thickness on the order of 1.6 mm. The effective air gap is equal to the thickness of the package, with the sensor die resting approximately in the center of the air gap.

The Hall effect sensor has leads 15 adapted for mounting to a printed circuit board (not shown). Leads 15, further described in association with FIG. 6, include a power, or Vcc, connection, a ground connection, and an output connection adapted to carry an output signal proportional to the current through the conductor 16. The output signal may be a current or a voltage.

The sensor die 14 includes a magnetic field sensing element 14a, for example, a Hall effect element 14a (FIGS. 1B and 6) and Hall circuitry 14b (FIGS. 1B and 6) for processing the output signal of the Hall effect element. In the illustrative embodiment, the Hall circuitry 14b includes an amplifier, a filter, an output driver, and an offset cancellation circuit. Also provided in the Hall circuitry 14b is a trim control circuit for adjusting the sensitivity and quiescent operating voltage, as is shown and described below in association with FIG. 6. Such a Hall effect sensor 12 is available from Allegro Microsystems, Inc. of Worcester, Mass. under part number A3525. It will be appreciated by those of ordinary skill in the art that other circuitry may be provided in the integrated Hall effect sensor 12. Use of the Hall effect sensor 12 enhances the integration of the current sensor 10 by incorporating circuit components which otherwise would be provided separately, such as by discrete components mounted to a printed circuit board.

Although a Hall effect sensor 12 is used in the current sensor 10 of FIG. 1, it will be appreciated by those of ordinary skill in the art that other types of magnetic field transducers, such as magnetic field transducers having an anisotropic magnetoresistance (AMR) element or a giant magnetoresistance (GMR) element, may alternatively be used.

The conductor 16 can be comprised of various conductive materials, such as copper, and is adapted for mounting to a printed circuit board through which the measured current is provided to the conductor 16. To this end, bent leads or tabs 16a, 16b (16b not shown) suitable for soldering into circuit board vias are provided at end portions of the conductor. Mechanisms other than bent tabs 16a, 16b may be used to mount the current sensor 10 to a circuit board, such as screw terminals and associated hardware or the flat leads or tabs 52a, 52b of FIGS. 2 and 2A. In alternate embodiments, the same or other mounting mechanisms can be used to allow the current sensor 10 to be mounted to other than a circuit board. For example, the current sensor 10 can have wire couplings (not shown) that allow the current sensor 10 to be coupled in series with a wire.

Preferably, the conductor 16 (excluding the bent tabs 16a, 16b) is substantially planar as shown, without features extending in the z-axis 21 which would increase the height of the current sensor 10 off of the printed circuit board. In use, the plane of the conductor 16 is positioned close to the printed circuit board plane, thereby providing a low profile current sensor.

The first notch 18a of the conductor 16 has a width w2 selected to receive at least a portion of the Hall effect sensor 12, which has a width w1. Preferably, the width w1 and the width w2 are sufficiently similar so that, in assembly, the possible movement of the Hall effect sensor 12 relative to the conductor 16 in the x-axis 19 is negligible. More specifically, nominal width w1 is slightly smaller than nominal width w2, such as by approximately 0.28 mm, so that, with worst case tolerances, the largest width w1 is 0.4 mm smaller than the smallest width w2. In the illustrated embodiment, nominal width w1 is 5.18 mm and nominal width w2 is 5.46 mm. Widths w1 and w2 can thus be characterized as being substantially equal.

The second notch 18b of the conductor has a width w3 selected to receive at least a portion of the magnetic core 24. Preferably, the width w3 and the width w4 of the central region 24a of the magnetic core are sufficiently similar, so that, in assembly, the possible movement of the magnetic core 24 relative to the conductor 16 in the x-axis 19 is negligible. More specifically, nominal width w4 is slightly smaller than nominal width w3, such as by approximately 0.2 mm, so that, with worst case tolerances, the smallest width w4 is 0.34 mm smaller than the largest width w3 and the largest width w4 is 0.08 mm smaller than the smallest width w3. In the illustrated embodiment, nominal width w3 is 5.46 mm and nominal width w4 is 5.25 mm. Widths w3 and w4 can thus be characterized as being substantially equal.

The spacing h3 between magnetic core legs 24b, 24c, the thickness or height h2 of the conductor 16 and the thickness or height h1 of the Hall effect sensor 12 are all substantially similar so that possible movement of the components relative to each other in the z-axis 21 is restricted. More specifically, nominal conductor height h2 and sensor height h1 are slightly smaller than nominal height h3, such as by approximately 0.1 mm, so that, with worst case tolerances, the smallest height h1 and height h2 are 0.22 mm smaller than the largest height h3 and the largest height h1 and height h2 are 0.01 mm smaller than the smallest height h3. In the illustrated embodiment, the nominal height h1 is 1.55 mm, the nominal height h2 is 1.50 mm, and the nominal height h3 is 1.64 mm.

In other embodiments, however, the spacing h3 is selected in accordance with other factors. For example, in one alternate embodiment, the spacing h3 is substantially larger than the height h1 of the Hall effect sensor 12, in order to increase the reluctance and, therefore, to increase the current through the carrying conductor 16 that would saturate the current sensor 10. Thus, this alternate embodiment has a greater current carrying capacity.

The magnetic core 24 tailors the magnetic field across the sensor die 14 and may be referred to alternatively as a magnetic field concentrator. The magnetic core 24 may be comprised of various materials including, but not limited to ferrite, steel, iron, iron alloy, nickel, cobalt, or permalloy. The material of the magnetic core 24 is selected based on factors such as maximum measured current and the desired amount of magnetic shielding provided by the C-shaped magnetic core 24. Other factors include stability of the relative permeability over temperature and hysteresis (magnetic remanence). For example, a low hysteresis ensures greater accuracy for small currents through the conductor 16. The material and size of the magnetic core 24 are also selected in accordance with the desired full scale current through the conductor 16, wherein a magnetic core material with a higher saturation flux density (Bsat) allows the use of a smaller core for a given current flowing through the conductor 16. As will become apparent from consideration of FIG. 4 below, use of the magnetic core 24 significantly reduces the susceptibility of the current sensor 10 to stray magnetic fields.

The magnetic core 24 has a depth d1, selected so that each of the legs 24b, 24c substantially covers an entire respective surface of the sensor die 14. With this arrangement, a substantially uniform magnetic field is provided across the Hall effect element 14a (FIG. 1B) provided on the sensor die 14, thereby increasing device sensitivity and reducing susceptibility to stray magnetic fields.

Here, the conductor notch 18a is formed by tabs 16d, 16e extending radially outward from the conductor. Notch 18b is formed by a narrowed region 16c of the conductor in combination with tabs 16f, 16g extending from the conductor. The width w5 of the narrowed region 16c between the first and the second notches 18a, 18b is selected based on the maximum current carrying capability of the electrical conductor 16. Here, the width w5 is on the order 1.7 mm and the current carrying capability of the conductor 16 is on the order of 100 Amperes. Although the notches 18a, 18b could be formed by radial tabs 16d, 16e, and 16f, 16g respectively, without providing the narrowed conductor region 16c, the use of the narrowed region 16c minimizes the overall dimension of the current sensor 10 along the y-axis 20. The narrowed region also provides the current through the conductor 16 in closer proximity to the Hall effect sensor 12. In an alternate embodiment, the notches 18a, 18b are formed without the tabs 16d-16g, and are provided only by the narrowed region 16c.

Referring also to FIG. 1A, in which like elements are labeled with like reference designations, the assembled exemplary current sensor 10 is shown. The magnetic field transducer 12, or Hall effect sensor, is encapsulated with an encapsulation 30. As is apparent, a portion of the Hall effect sensor 12 is positioned in like-dimensioned conductor notch 18a (FIG. 1) and the central region 24a of the magnetic core 24 is positioned in like-dimensioned conductor notch 18b (FIG. 1). The leads 15 are bent to facilitate mounting of the current sensor 10 to a printed circuit board. Advantageously, the current sensor 10 is a low profile assembly, with the height of the current sensor off of the printed circuit board determined by the thickness of the molded body 28.

The molded body 28 comprising an electrically insulating material is disposed over the magnetic core 24, a portion of the conductor 16, and the Hall effect sensor 12, as shown. The molded body 28 further reduces movement of the elements relative to each other by additionally preventing movement in the direction of the x-axis 19, y-axis 20, and z-axis 21.

With this arrangement, the magnetic core 24, the conductor 16, and the Hall effect sensor 12 are fixed in place relative to each other. The result of this mechanical "interlock" is highly repeatable and tightly controlled current sensor performance.

Referring now to FIG. 1B, in which like elements of FIGS. 1 and 1A are labeled with like reference designations, the sensor die 14 is shown to include the Hall effect element 14a having a width w7 along the x-axis 19, a width w8 along the y-axis 20, and center labeled 14c. The sensor die 14 also includes circuitry 14b, here shown as a representative block coupled to the Hall effect element 14a. The Hall effect element 14a and the circuitry 14b are shown in greater detail in FIG. 6.

The Hall effect element 14a and the circuitry 14b are formed on a single die, which is encapsulated and provided in the form of a single integrated circuit Hall effect sensor 12. In an alternate embodiment, the Hall effect element 14a and the associated circuitry 14b can be formed as separate integrated circuits coupled with wire bonds or the like. The Hall circuitry 14b is electrically coupled to the leads 15 (FIGS. 1, 1A) of the Hall effect sensor 12.

Figure 2:
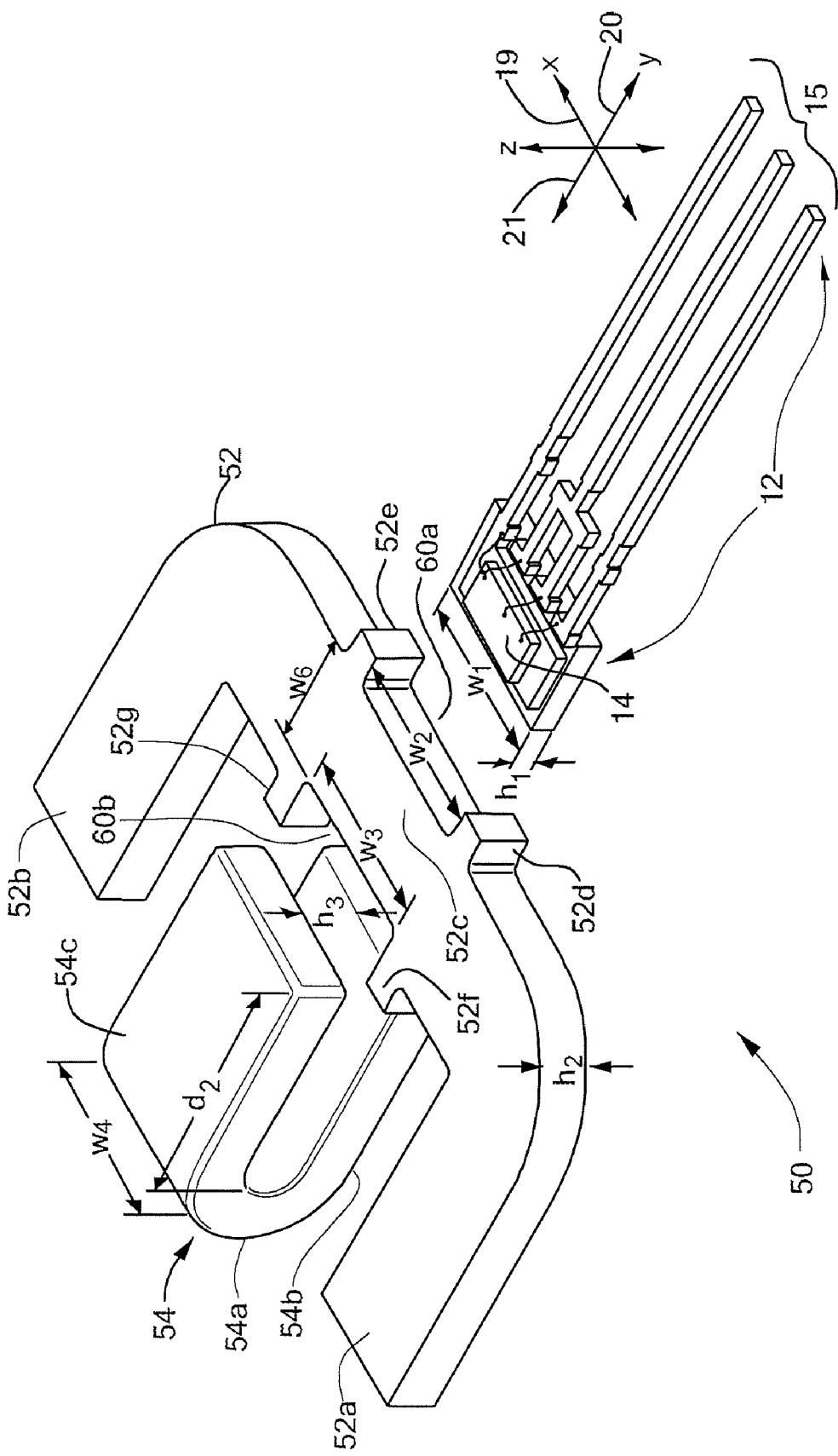
FIG. 2 is an exploded isometric view of an alternative current sensor in accordance with the present invention.
Figure 2A:
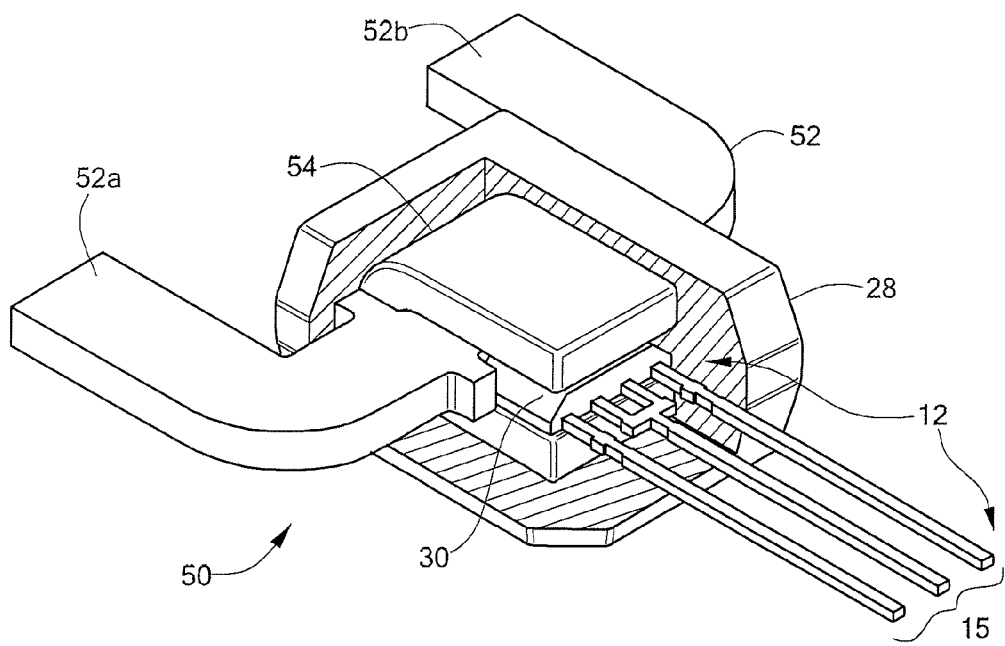
FIG. 2A is an isometric view of the assembled current sensor of FIG. 2.

Referring to FIGS. 2 and 2A, in which like elements of FIGS. 1 and 1A are labeled with like reference designations, an alternative exemplary current sensor 50 includes the Hall effect sensor 12, a conductor 52, and a magnetic core 54. The conductor 52, like conductor 16 of FIGS. 1 and 1A, has a first notch 60a and a second notch 60b substantially aligned with the first notch. The first notch 60a has a width w2, which is sufficiently similar to the width w1 of the Hall effect sensor 12 so as to restrict the relative movement of the elements in the x-axis 19 and the second notch 60b has width w3, which is sufficiently similar to the width w4 of the magnetic core 54 so as to restrict the relative movement of the elements in the x-axis.

The magnetic core 54 has a central region 54a of width w4 and a pair of substantially parallel legs 54b, 54c extending from the central region and separated by a height h3. The depth d2 of the magnetic core 54 is selected so that each of the legs 54b, 54c covers substantially an entire respective surface of the sensor die 14.

The height h1 of the Hall effect sensor 12, the height h2 of the conductor 52, and the separation h3 of the parallel legs 54b, 54c are sufficiently similar, so that, in assembly, the legs 54b, 54c prevent relative movement of the elements along the z-axis 21. The widths w1, w2, w3, w4, and heights h1, h2, and h3 are substantially identical to like dimensions in the current sensor 10 of FIG. 1.

In assembly, as shown in FIG. 2A, a portion of the Hall effect sensor 12 is disposed in the first notch 60a and a portion of the magnetic core 54 is disposed in the second notch 60b, as shown. With this arrangement, the magnetic core 54, the conductor 52, and the Hall effect sensor 12 are prevented from moving relative to each other along the x-axis 19 and z-axis 21. Molded body 28 is provided over the magnetic core 54, portions of the conductor 52, and the Hall effect sensor 12 to further reduce movement of the elements relative to each other along the x-axis 19, y-axis 20, and z-axis 21.

The current sensor 50 differs from current sensor 10 of FIGS. 1 and 1A generally in features of the conductor 52 and the magnetic core 54. In particular, the conductor 52 has flat leads or tabs 52a, 52b which serve as the mounting mechanism for mounting the conductor 52 to a circuit board (not shown). In use, a hole or depression is provided in the printed circuit board. The molded body 28 is positioned in the hole or depression such that the tabs 52a and 52b rest flat on the surface of the printed circuit board over plated pads to which they are soldered by conventional surface mount techniques.

The electrical conductor 52 has a narrowed region 52c separating the first and the second notches 60a, 60b. Here, notch 52a is formed by tabs 52e, 52f extending radially outward from the conductor and notch 52b is formed by a combination of radial tabs 52g, 52h and narrowed region 52c. The narrowed region 52c has a width w6, which is greater than the width w5 of the narrowed region 16c (FIGS. 1 and 1A). Thus, notch 60b is not as deep as notch 18b (FIGS. 1 and 1A). Accordingly, the electrical resistance of the narrowed region 52c is less than the resistance of the narrowed region 16c of FIG. 1. Thus, less power is dissipated per ampere flowing through the narrowed regions 52c. Since the width w6 of the narrowed region 60c is associated with the maximum current carrying capability of the sensor 50, the conductor 52 is adapted to carry more current than the conductor 16 of FIG. 1. In the illustrative embodiment, the width w6 is 3 mm and the maximum current carrying capacity of the conductor 52 is 200 Amperes. In an alternate embodiment, the notches 60a, 60b are formed without the tabs 52d-52g, and are provided only by the narrowed region 52c.

Magnetic core 54 differs from magnetic core 24 of FIGS. 1 and 1A in that the central region 54a is curved relative to the parallel legs 54b, 54c. The shape of the magnetic core 54, here a C-shape is selected in accordance with a variety of factors, including, but not limited to the material of the magnetic core 54. The factors used to select the material of the core 54 are the same as those described above for the magnetic core 24 of FIG. 1. In one illustrative embodiment, the core 54 is comprised of a silicon steel alloy, which has a higher saturation flux density than ferrite. Also, the depth d2 is greater than the depth d1 of the exemplary embodiment of FIG. 1, adapted to the width w6 that is greater than the width w5 in the embodiment of FIG. 1.

Figure 3:
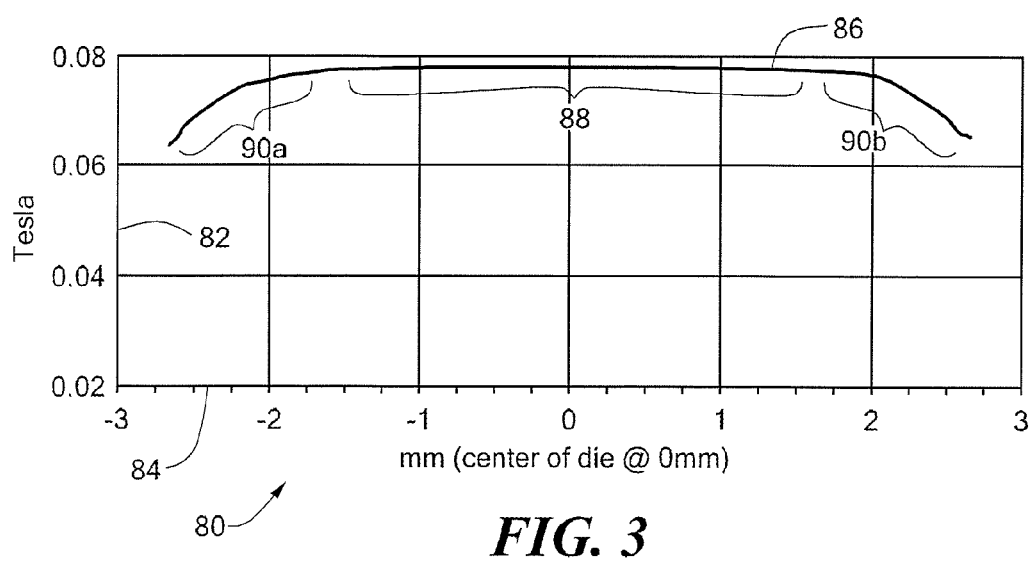
FIG. 3 is a graph of the magnetic field at a Hall effect element contained in the current sensor of FIGS. 1 and 2 as measured in the x-axis of the Hall effect element plane.

Referring to FIG. 3, a graph 80 illustrates the magnetic flux density along the x-axis 19 of the sensor die 14 when 100 A is passed through the conductor 52 of the exemplary current sensor 50 of FIGS. 2 and 2A. The center 14c of the Hall effect element 14a within the sensor die 14 (FIG. 1B) corresponds to zero millimeters on the abscissa 84.

The magnetic flux curve 86 can be characterized as having a central portion 88 that is essentially flat and inclined end portions 90a, 90b. Consideration of curve 86 reveals that the magnetic flux is substantially constant in the central portion 88, for a span on the order of 4 mm, centered about the element center 14c of the Hall effect element 14a. Portions of the Hall effect element 14a located more than 2 mm from the Hall effect element center 14c along the x-axis 19 experience reduced magnetic flux density. The illustrative Hall effect element 14a has an x-axis width w7 on the order of 0.2 mm, centered on the sensor die 14 typically having dimensions of approximately 1.6 mm by 3 mm, and therefore the entire Hall effect element 14a lies in the central portion 88. The width of central portion 88 is substantially greater than the width w7 (FIG. 1B) of the Hall effect element 14a, and the Hall effect element 14a is sufficiently centered within the central portion 88 to ensure that the Hall effect element 14a is within the greatest amount of magnetic field.

It will be appreciated by those of ordinary skill in the art that the dimensions of the magnetic core 54 relative to the Hall effect element 14a significantly affect the uniformity of the flux density across the Hall effect element 14a in the x-axis 19. In particular, the wider the magnetic core 54 (i.e., the greater the width w4), relative to the width w7 of the Hall effect element 14a, the longer the central portion 88 of the curve 86, whereas, the narrower the magnetic core, the shorter the central portion 88.

Curve 86 presumes that the magnetic core 54 and Hall effect element 14a are centered relative to one another in the x-axis 19, as is ensured by their fixed placement relative to aligned conductor notches 60a, 60b. Movement of the Hall effect element 14a relative to the magnetic core 54 along the x-axis 19 would result in the curve 86 moving along the abscissa 84 and thus, result in areas of the Hall effect element 14a even closer to its center 14c than 2 mm, experiencing significantly reduced flux density. This effect highlights the desirability of restricting relative movement of the Hall effect sensor 12 and the magnetic core 54. Further, since there is a tolerance associated with the location of the sensor die 14 and associated Hall effect element 14a (FIG. 1B) within the Hall effect sensor 12, fixing the position of the Hall effect sensor 12 relative to the magnetic core 54 is critical.

Figure 3A:
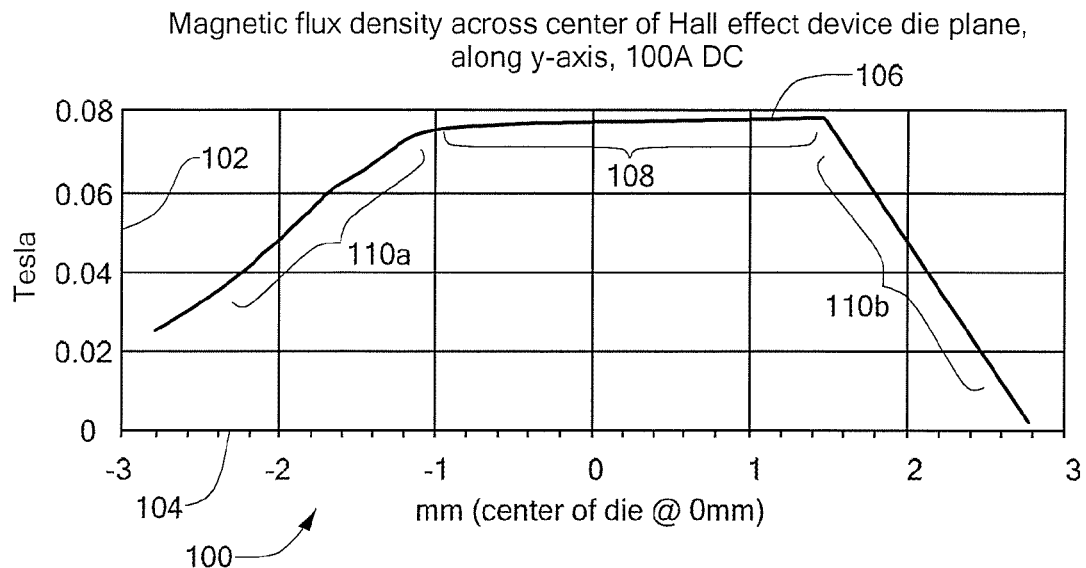
FIG. 3A is a graph of the magnetic field at the Hall effect element contained in the current sensor of FIGS. 1 and 2 as measured in the y-axis of the Hall effect element plane.

Referring also to FIG. 3A, a graph 100 illustrates the magnetic flux density along the y-axis 20 of the sensor die 14 when 100 A is passed through the conductor of the exemplary current sensor 50 of FIGS. 2 and 2A. The center 14c of the Hall effect element 14a corresponds to zero millimeters on the abscissa 84.

The magnetic flux curve 106 can be characterized as having a central portion 108 that is essentially flat and inclined end portions 110a, 110b. Consideration of curve 106 reveals that the magnetic flux is substantially constant in the central portion 108, for a span on the order of 2.5 mm, centered about the center 14c of the Hall effect element 14a. Portions of the Hall effect element 14a located more than 1.25 mm from the Hall effect element center 14c along the y-axis 20 experience reduced magnetic flux density. The illustrative Hall effect element 14a has a y-axis width w8 on the order of 0.2 mm, centered on the sensor die 14 typically having dimensions of approximately 1.6 mm by 3 mm, and therefore the entire Hall effect element 14a lies in the central portion 108. The width of central portion 108 is substantially greater than the width w8 (FIG. 1B) of the Hall effect element 14a, and the Hall effect element 14a is sufficiently centered within the central portion 108 to ensure that the Hall effect element 14a is within the greatest amount of magnetic field.

It will be appreciated by those of ordinary skill in the art that the dimensions of the magnetic core 54 relative to the Hall effect element 14a significantly affect the uniformity of the flux density across the Hall effect element 14a in the y-axis 20. In particular, the deeper the magnetic core 54 (i.e., the greater the depths d2, FIG. 2), relative to the width w8 of the Hall effect element 14a, the longer the central portion 108 of the curve 106, whereas, the shallower the magnetic core, the shorter the central portion 108.

Curve 106 presumes that the magnetic core 54 and Hall effect element 14a are centered relative to one another in the y-axis 20, as is ensured by their fixed placement relative to aligned conductor notches 60a, 60b. Movement of the Hall effect element 14a relative to the magnetic core 54 along the y-axis 20 would result in the curve 106 moving along the abscissa 104 and thus, result in areas of the Hall effect element 14a, even closer to its center 14c than 1.25 mm, experiencing significantly reduced flux density. This effect again highlights the desirability of restricting relative movement of the Hall effect sensor 12 and the magnetic core 54.

Figure 4:
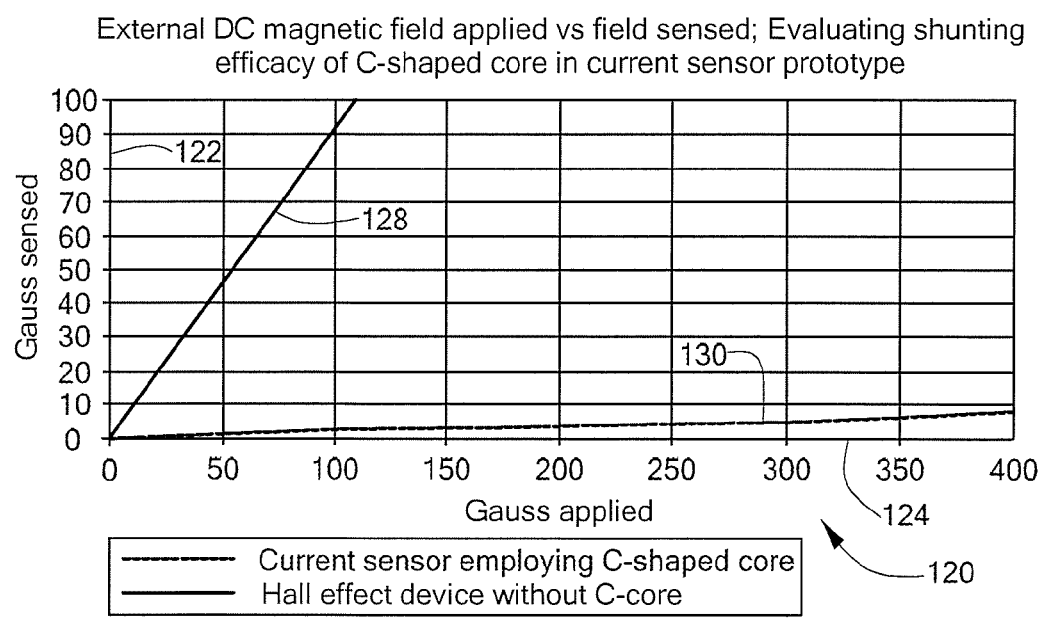
FIG. 4 is a graph showing the magnetic field sensed by the Hall effect sensor of FIG. 2 with and without the magnetic core.

Referring to FIG. 4, a graph 120 illustrates the significance of the magnetic core 24 (FIGS. 1, 1A) in reducing the effect of stray, or external, magnetic fields. The abscissa 124 represents an external magnetic field applied along the z-axis 21 (FIG. 1) to the current sensor of FIG. 1A (as contrasted to the magnetic field generated by a current passing through the conductor 16) and the ordinate 122 represents the magnetic field sensed by the current sensor 10. Curve 128 corresponds to a current sensor of the type shown in FIGS. 1 and 1A, but without the C-shaped magnetic core 24 and curve 130 corresponds to the current sensor 10 having the magnetic core 24. Curve 128 shows that the magnetic field sensed by the Hall effect sensor 12 is substantially the same as the externally applied field; whereas, curve 130 shows that, with the magnetic core 24, the magnetic field sensed by the current sensor 10 is significantly less than the externally applied field.

Figure 5:
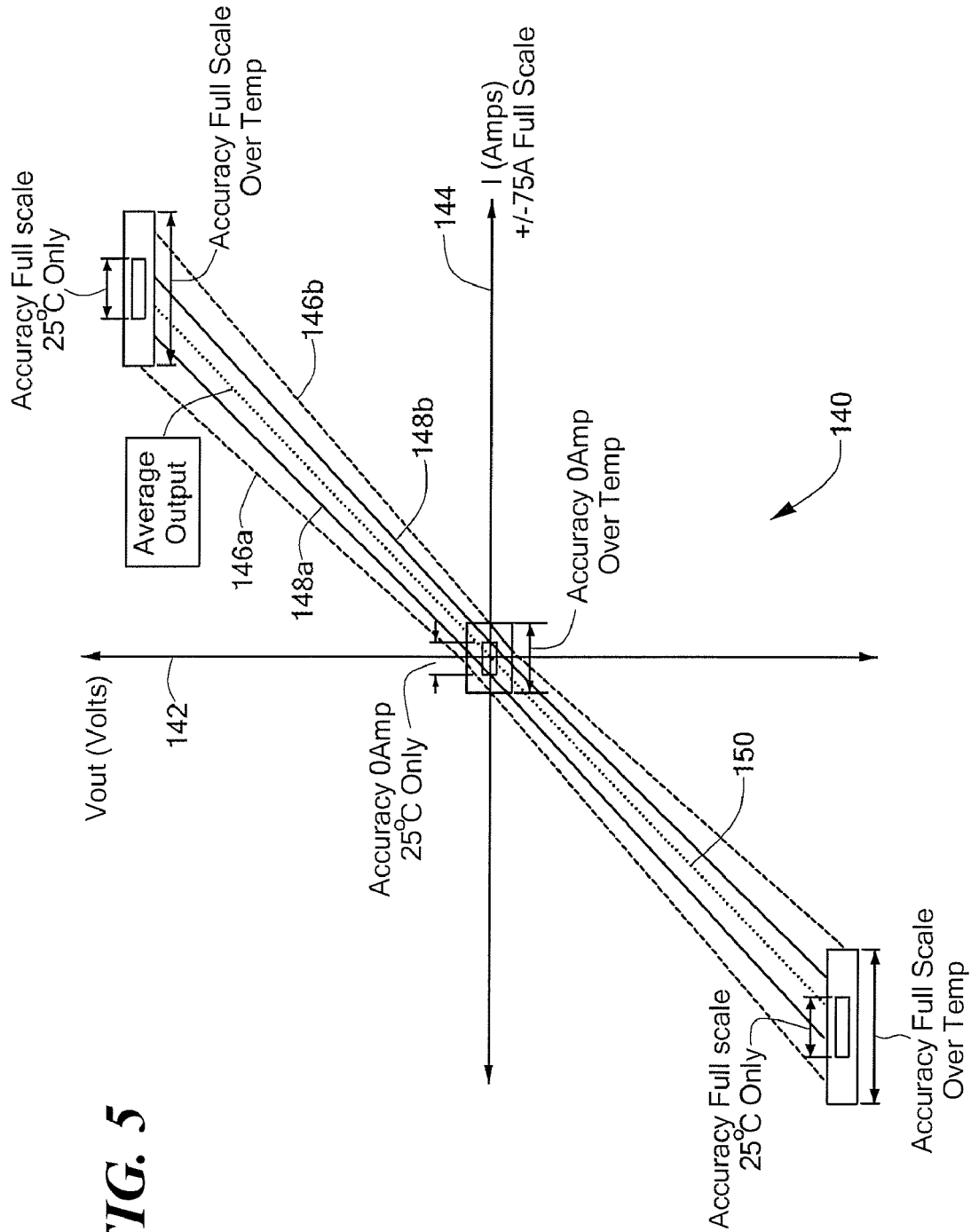
FIG. 5 is a graph showing the accuracy of the current sensor of FIG. 2.

Referring to FIG. 5, a graph 140 illustrates the accuracy performance of the current sensor 10 of FIGS. 1 and 1A. The accuracy represents the maximum deviation of the actual sensor output from its ideal value. The current through the conductor 16 is shown on the abscissa 144 and the voltage of the current sensor output signal is shown on the ordinate 142.

The ideal relationship between current through the conductor and output voltage is illustrated by curve 150, here a straight line. Curves 146a and 146b represent the accuracy bounds of sensing current flow over a range of temperatures. More particularly, curves 146a and 146b represent the accuracy bounds of sensing current flow throughout the temperature range of −40° C. to +85° C. Curves 148a and 148b represent the accuracy bounds of sensing current flow at a fixed temperature of 25° C.

Figure 6:
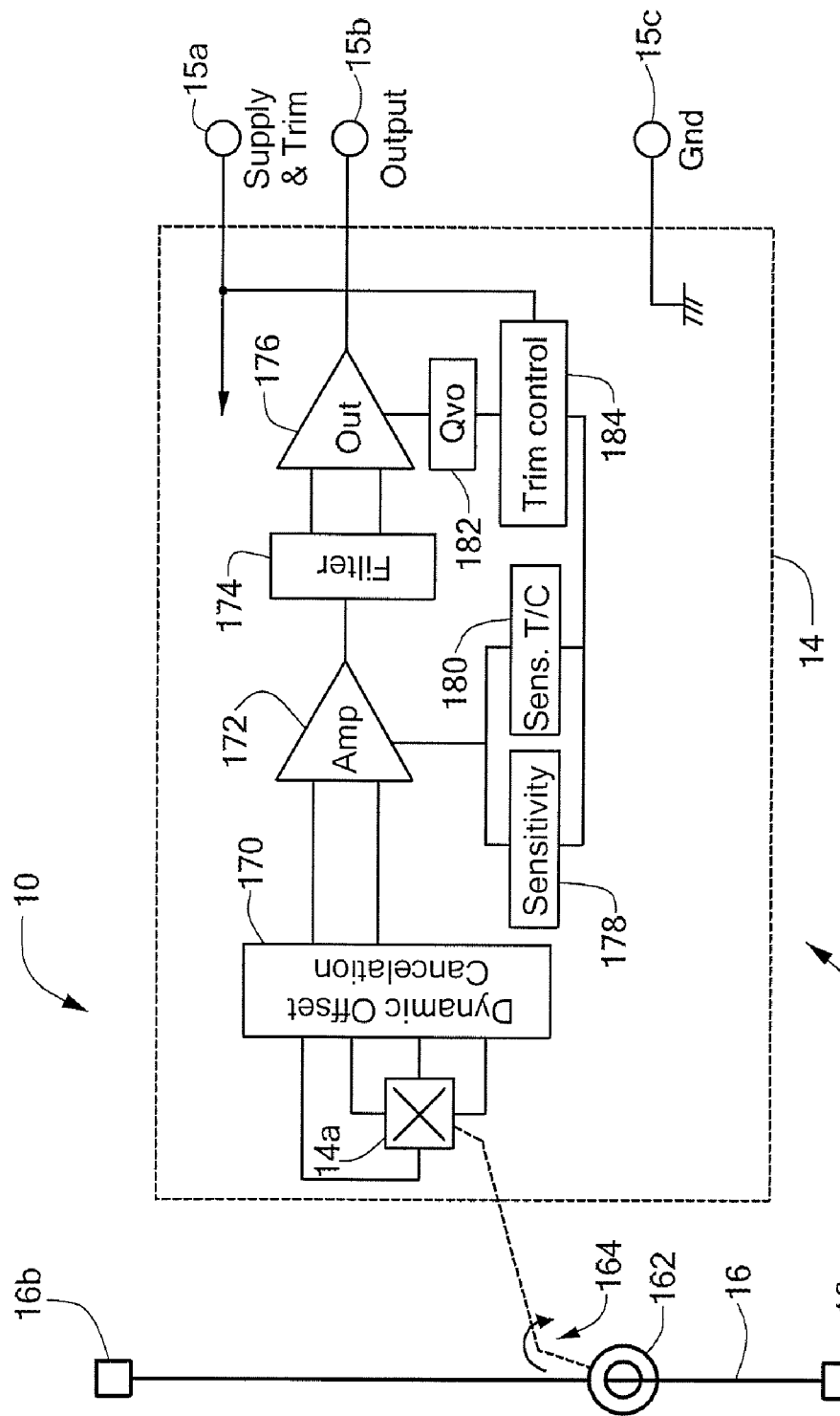
FIG. 6 is a block diagram of the current sensor of FIG. 1.

Referring to FIG. 6, a schematic representation of the exemplary Hall effect current sensor 10 of FIGS. 1, 1A, and 1B includes the conductor 16 represented by a line having circuit board mounting mechanisms 16a, 16b, and the magnetic core 24 here represented by a toroid 162. The illustrative Hall effect sensor 12 includes the sensor die 14 and leads 15, here labeled 15a, 15b, and 15c. Lead 15a provides a power connection to the Hall effect current sensor 12, lead 15b provides a connection to the current sensor output signal, and lead 15c provides a reference, or ground connection to the current sensor.

The Hall effect element 14a senses a magnetic field 164 induced by a current flowing in the conductor 16, producing a voltage in proportion to the magnetic field 164. The Hall effect element 14a is coupled to a dynamic offset cancellation circuit 170, which provides a DC offset adjustment for DC voltage errors associated with the Hall effect element 14a. When the current through the conductor 16 is zero, the output of the dynamic offset cancellation circuit 170 is adjusted to be zero.

The dynamic offset cancellation circuit 170 is coupled to an amplifier 172 that amplifies the offset adjusted Hall output signal. The amplifier 172 is coupled to a filter 174 that can be a low pass filter, a high pass filter, a band pass filter, and/or a notch filter. The filter is selected in accordance with a variety of factors including, but not limited to, desired response time, the frequency spectrum of the noise associated with the Hall effect element 14a, the dynamic offset cancellation circuit 170, and the amplifier 172. In one particular embodiment, the filter 174 is a low pass filter. The filter 174 is coupled to an output driver 176 that provides an enhanced power output for transmission to other electronics (not shown).

A trim control circuit 184 is coupled to lead 15a through which power is provided during operation. Lead 15a also permits various current sensor parameters to be trimmed, typically during manufacture. To this end, the trim control circuit 184 includes one or more counters enabled by an appropriate signal applied to the lead 15a.

The trim control circuit 184 is coupled to a quiescent output voltage (Qvo) circuit 182. The quiescent output voltage is the voltage at output lead 15b when the current through conductor 16 is zero. Nominally, for a unipolar supply voltage, Qvo is equal to Vcc/2. Qvo can be trimmed by applying a suitable trim signal through the lead 15a to a first trim control circuit counter within the trim control circuit 184 which, in turn, controls a digital-to-analog converter (DAC) within the Qvo circuit 182.

The trim control circuit 184 is further coupled to a sensitivity adjustment circuit 178. The sensitivity adjustment circuit 178 permits adjustment of the gain of the amplifier 172 in order to adjust the sensitivity of the current sensor 10. The sensitivity can be trimmed by applying a suitable trim signal through the lead 15a to a second trim control circuit counter within the trim control circuit 184 which, in turn, controls a DAC within the sensitivity adjustment circuit 178.

The trim control circuit 184 is further coupled to a sensitivity temperature compensation circuit 180. The sensitivity temperature compensation circuit 180 permits adjustment of the gain of the amplifier 172 in order to compensate for gain variations due to temperature. The sensitivity temperature compensation can be trimmed by applying a suitable trim signal through the lead 15a to a third trim control circuit counter within the trim control circuit 184 which, in turn, controls a DAC within the sensitivity temperature compensation circuit 180.

It will be appreciated by those of ordinary skill in the art that the circuitry shown in FIG. 6 is illustrative only of exemplary circuitry that may be associated with and integrated into a Hall effect current sensor, like the Hall effect current sensor 10 of FIG. 1. In another embodiment, additional circuitry may be provided for converting the current sensor into a "digital fuse" which provides a high or low output signal depending on whether the magnetic field 164 induced by the current through the conductor 16 is greater or less than a predetermined threshold level. The additional circuitry for this alternative embodiment can include a comparator and/or a latch, and/or a relay. An exemplary embodiment of a digital fuse is shown in FIG. 7.

Further, since the conductor connections 16a, 16b are electrically isolated from the current sensor leads 15a, 15b, and 15c, the current sensor 10 can be used in applications requiring electrical isolation without the use of opto-isolators or other isolating techniques, such as transformers.

Figure 7:
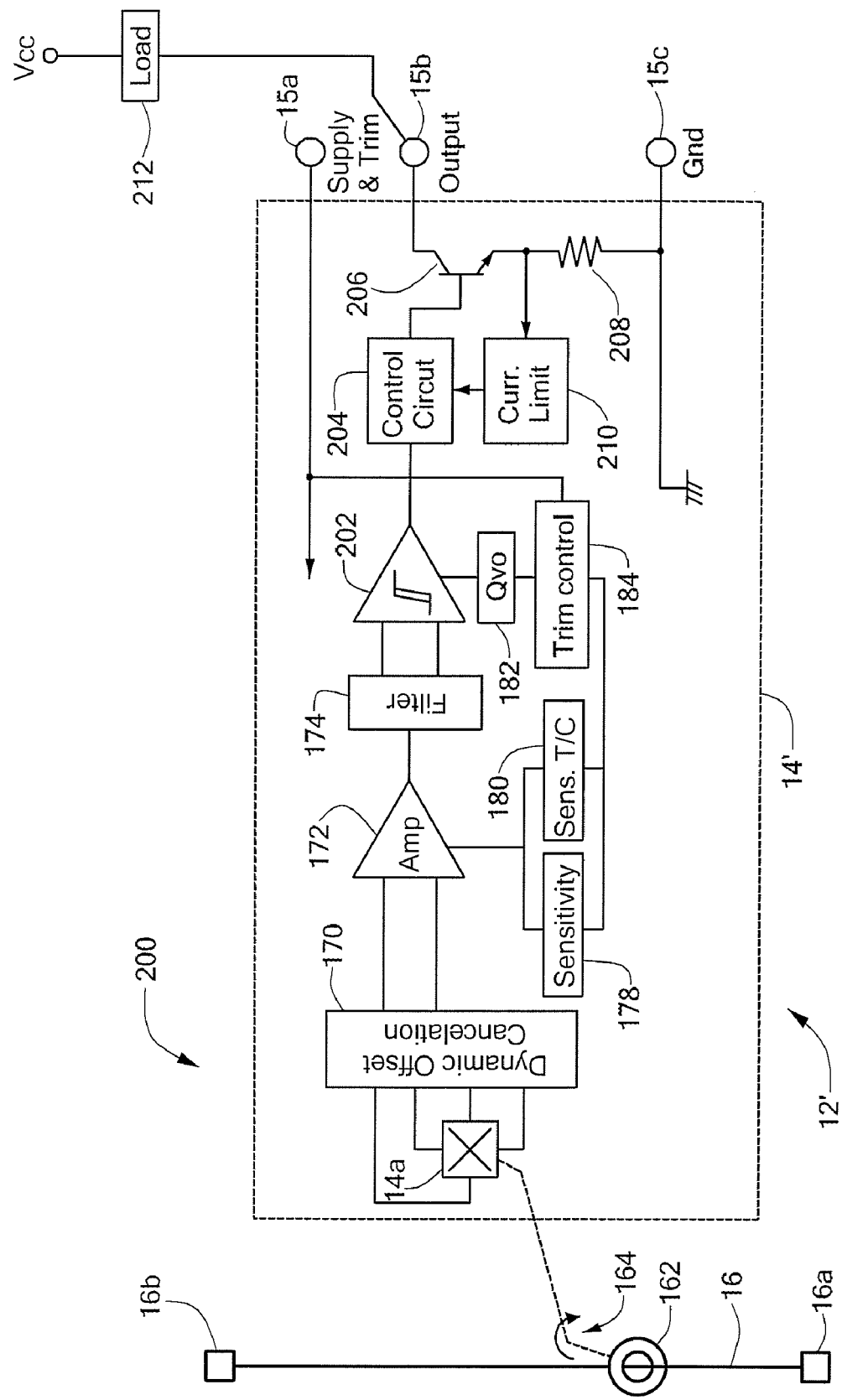
FIG. 7 is a block diagram of an exemplary digital fuse circuit that can be provided in the same form as the current sensor of FIG. 1, including the core and conductor of FIG. 1 but including an alternative Hall effect sensor as shown.

Referring now to FIG. 7, in which like elements of FIG. 6 are shown having like reference designations, an exemplary digital fuse circuit 200 includes conductor 16, core 162 and a Hall effect sensor 12' including a sensor die 14'. The die 14' includes a Schmitt trigger 202 coupled to the filter 174. The Schmitt trigger provides an output signal in a first digital state when the magnetic field 164 is below a first threshold value and a second digital state when the magnetic field 164 is above a second threshold value. The first digital state corresponds to a low current through the conductor 16. The second digital state corresponds to a higher current through the conductor 16. The Schmitt trigger output signal is provided to a control circuit 204 that provides a control signal to a transistor 206. The control signal causes transistor 206 to conduct when the Schmitt trigger output signal is in one of the two digital states and causes transistor 206 to be off when the Schmitt trigger output signal is in the other one of the two digital states. A resistor 208 in combination with a current limit circuit 210 limits the current through the transistor 206.

The output lead 15b (FIG. 1) can be coupled to a load 212, not part of the digital fuse circuit 200, and the load 212 therefore receives electrical current from a power supply Vcc in response to the on or off condition of the transistor 206. For example, in one embodiment, the load 212 receives full current when the magnetic field 164 is below the first threshold, corresponding to a low current through the conductor 16, and the load 212 receives zero current when the magnetic field 164 is above the second threshold value, corresponding to a higher current through the conductor. It will be appreciated by those of ordinary skill in the art that a flip-flop or latch may be included in order to allow the state of the transistor 206 to be latched to either the on or the off condition.

Figure 8:
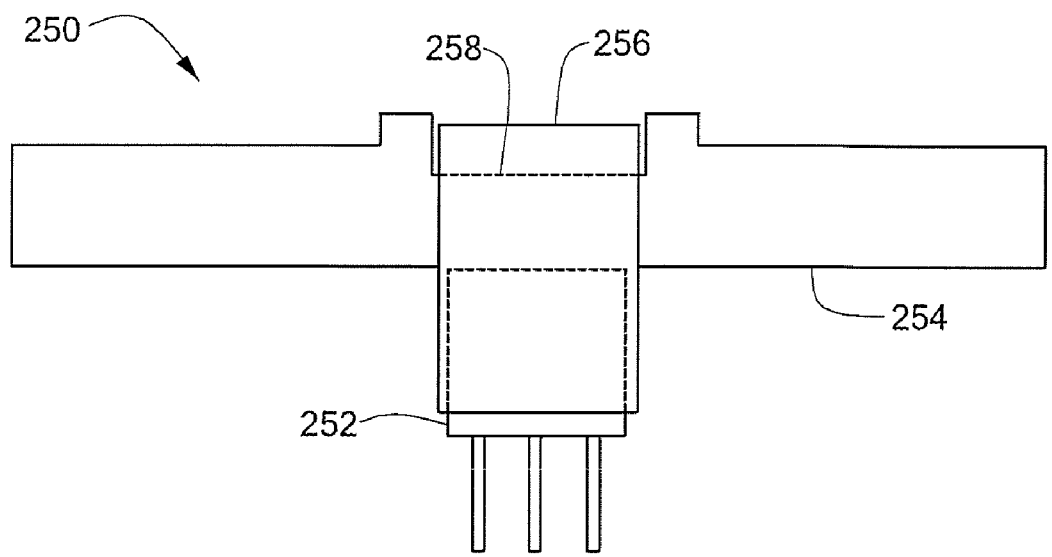
FIG. 8 is a plan view showing an alternate arrangement of the current sensor in accordance with the present invention.

Referring now to FIG. 8, an integrated current sensor 250 includes a magnetic field transducer, here in the form of Hall effect sensor 252, a current-carrying conductor 254, and a magnetic core 256. The magnetic core 256 is the type of magnetic core 24 shown in FIG. 1 and the Hall effect sensor 252 is the type of sensor 12 shown in FIG. 1. In this embodiment, the current-carrying conductor 254 has only one notch 258. The notch 258 is comparable to the notch 18b of FIG. 1, providing the same capabilities and advantages. Thus, the notch 258 is adapted to receive a portion of the like-dimensioned magnetic core 256, aligning the magnetic core in essentially the same way as described in conjunction with FIG. 1.

A molded body (not shown), similar to the molded body 28 of FIG. 1A, can be provided to further reduce movement of the elements relative to each other. The conductor 254 is substantially planar, without features extending in the z-axis. In use, the conductor is positioned close to the surface of the printed circuit board, thereby avoiding additional height off of the printer circuit board.

While the current sensor 250 is shown having the one notch 258 in association with the magnetic core 256, in another embodiment, an alternate current sensor has only one notch, comparable to the notch 18a of FIG. 1, adapted to receive the like-dimensioned Hall effect sensor (e.g., Hall effect sensor 152).

Figure 8A:
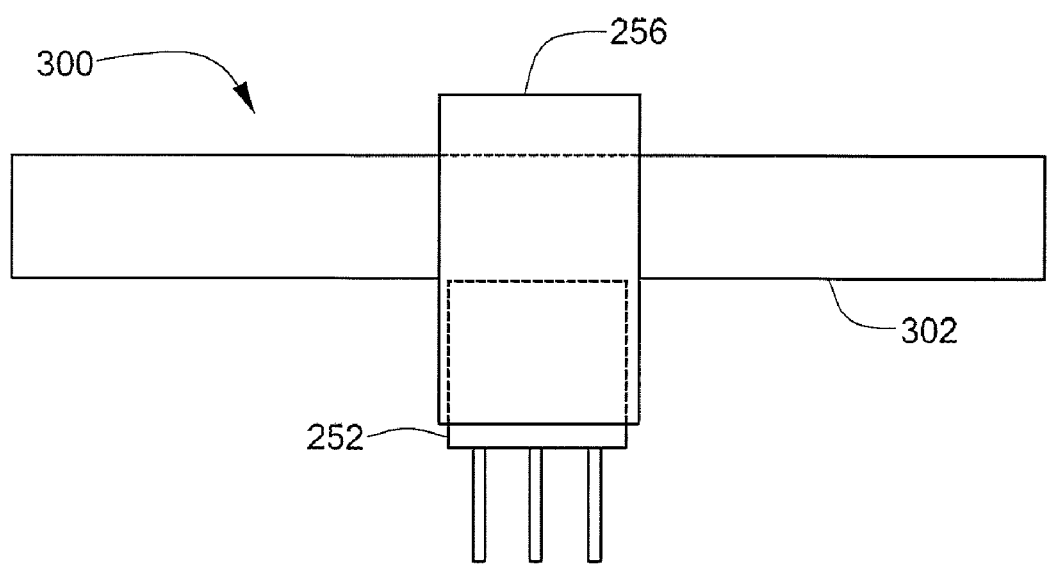
FIG. 8A is a plan view showing another alternate arrangement of the current sensor in accordance with the present invention.

Referring now to FIG. 8A, in which like elements of FIG. 8 are shown having like reference designations, an integrated current sensor 300 includes a magnetic field transducer, here in the form of the Hall effect sensor 252, a current-carrying conductor 302, and the magnetic core 256. In this embodiment, the current-carrying conductor 302 has no notches comparable to the notches 18a, 18b of FIG. 1 for receiving a portion of the sensor 254 and/or core 256. Rather, the Hall effect sensor 252 is juxtaposed with respect to an edge of the conductor 302 as shown and the magnetic core is positioned to straddle the opposite edge of the conductor 302 so that each of the legs of the core covers a substantial portion of a respective surface of the Hall effect sensor. Here again, the conductor 302 is substantially planar.

A molded body (not shown), similar to the molded body 28 of FIG. 1A, can be provided to further reduce movement of the elements relative to each other. Thus, this particular embodiment can rely upon a molded body to keep the elements in a substantially fixed relative position.

Figure 9:
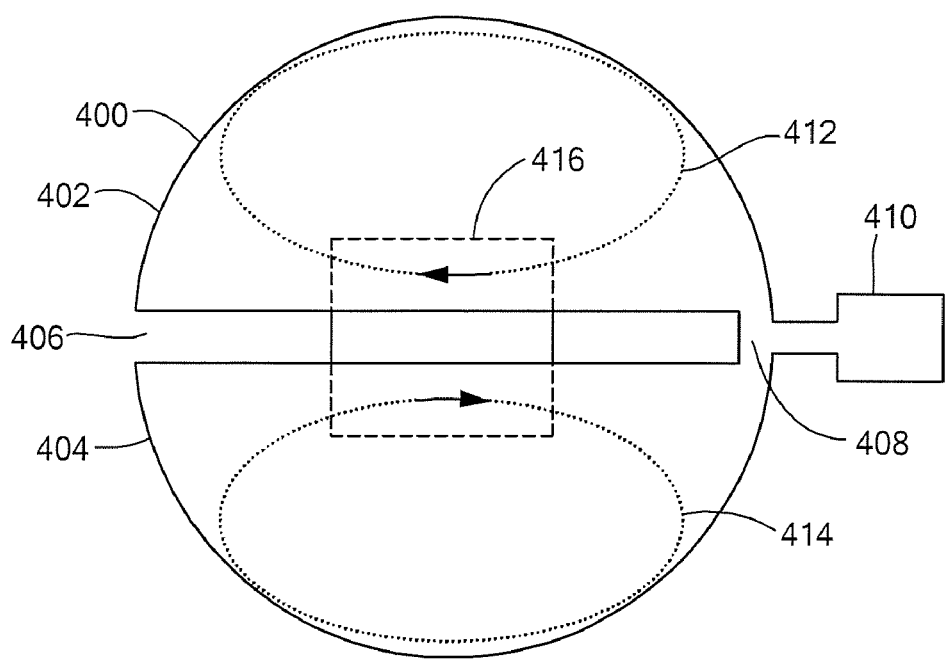
FIG. 9 is a top view of an electromagnetic shield that can form part of a current sensor.

Referring now to FIG. 9, an electromagnetic shield 400 includes a first portion 402 and a second portion 404 separated by a slit 406. The first portion 402 and the second portion 404 are coupled with a conductive region 408. A bonding pad 410 allows the electromagnetic shield 400 to be coupled to a DC voltage, for example, a ground voltage.

In one particular arrangement, the electromagnetic shield 400 can be formed from a metal layer during manufacture of a current sensor, for example, the current sensor 600 of FIG. 13, described more fully below. The metal layer can be comprised of a variety of materials, for example, aluminum, copper, gold, titanium, tungsten, chromium, or nickel.

In the presence of an AC magnetic field (e.g., a magnetic field surrounding a current carrying conductor), it will be understood that AC eddy currents 412, 414 can be induced in the electromagnetic shield 400. The eddy currents 412, 414 form into closed loops as shown. The closed loop eddy currents 412, 414 tend to result in a smaller magnetic field in proximity to the electromagnetic shield 400 than the magnetic field that induced the eddy current 412, 414. Therefore, if the electromagnetic shield 400 were placed near a Hall effect element 416, for example, the Hall effect element 14 of FIG. 1, the Hall effect element 416 would experience a smaller magnetic field than it would otherwise experience, resulting in a less sensitive current sensor, which is generally undesirable. Furthermore, if the magnetic field associated with the eddy current is not uniform or symmetrical about the Hall effect element 416, the Hall effect element 416 might also generate an undesirable offset voltage.

The slit 406 tends to reduce a size (i.e., a diameter or path length) of the closed loops in which the eddy currents 412, 414 travel. It will be understood that the reduced size of the closed loops in which the eddy currents 412, 414 travel results in smaller eddy currents 412, 414 and a smaller local affect on the AC magnetic field that induced the eddy current. Therefore, the sensitivity of a current sensor on which the Hall effect element 416 and the electromagnetic shield 400 are used is less affected by the smaller eddy currents.

Furthermore, by placing the shield 400 in relation to the Hall effect element 416 as shown, so that the slit 406 passes over the Hall effect element 416, it will be understood that the magnetic field associated with any one of the eddy currents 412, 414 tends to form magnetic fields passing through the Hall effect element 416 in two directions, canceling over at least a portion of the area of the Hall effect element 416.

Nickel, listed above as a possible material for the electromagnetic shield 400, is a ferromagnetic material and might tend to concentrate magnetic flux, resulting in a different flux density at the magnetic field transducer 416 and different sensitivity, even in the absence of AC eddy currents. However, in some arrangements, the electromagnetic shield 400 can be made thin, so that it saturates at low magnetic fields. In these arrangements, the electromagnetic shield 400, even if made of a ferromagnetic material, can have reduced magnetic effect upon the magnetic field transducer 416.

Figure 10:
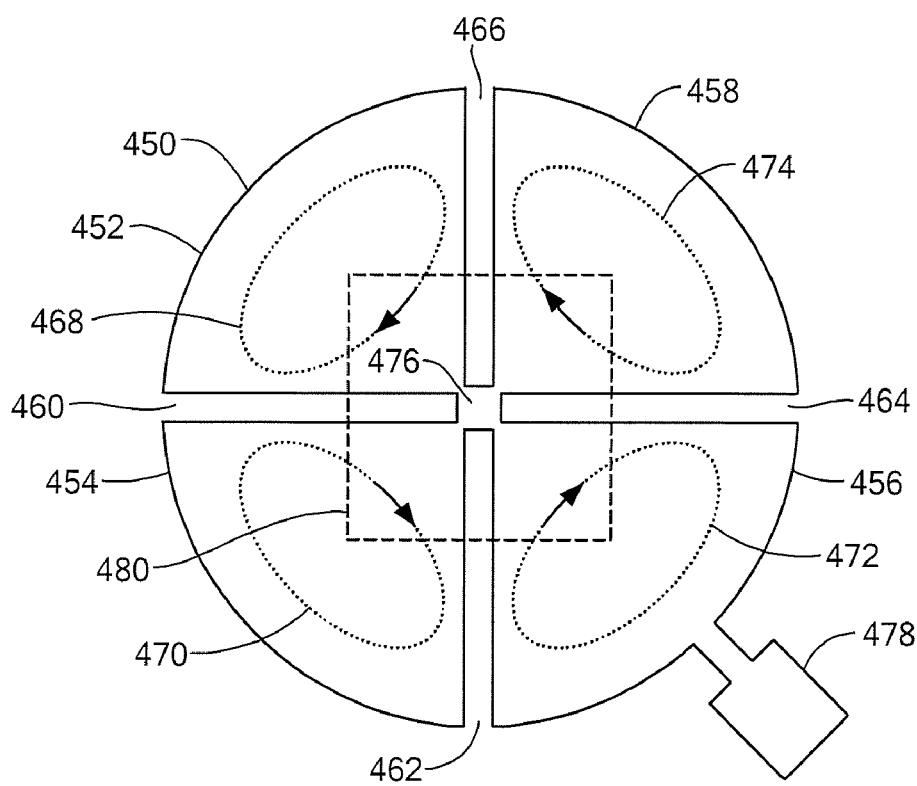
FIG. 10 is a top view of another electromagnetic shield that can form part of a current sensor.

Referring now to FIG. 10, an electromagnetic shield 450 includes four portions 452-458 separated by four slits 460-466. The four portions 452-458 are coupled with a conductive region 476. A bonding pad 478, allows the electromagnetic shield 450 to be coupled to a DC voltage, for example, a ground voltage.

In the presence of a magnetic field, it will be understood that eddy currents 468-474 can be induced in the electromagnetic shield 450. Due to the four slits 460-466, it will be understood that a size (i.e., a diameter or a path length) of the closed loops eddy currents 466-474 tends to be smaller than the size of the closed loop eddy currents 412, 414 of FIG. 9. It will be understood that the reduced size of the closed loops in which the eddy currents 468-474 travel results in smaller eddy currents 468-474 and a smaller local affect on the AC magnetic field that induced the eddy current than that which results from the shield 400 of FIG. 9. Therefore, the sensitivity of a current sensor on which a Hall effect element 480 and the electromagnetic shield 450 are used is less affected by the smaller eddy currents 468-474 than the sensitivity of a current sensor using the shield 400 of FIG. 9.

Furthermore, by placing the shield 450 in relation to the Hall effect element 480 as shown, so that the slits 460-466 pass over the Hall effect element 480, it will be understood that the magnetic field associated with any one of the eddy currents 468-474, tends to form magnetic fields passing through the Hall effect element 480 in two directions, canceling over at least a portion of the area of the Hall effect element 480.

Figure 11:
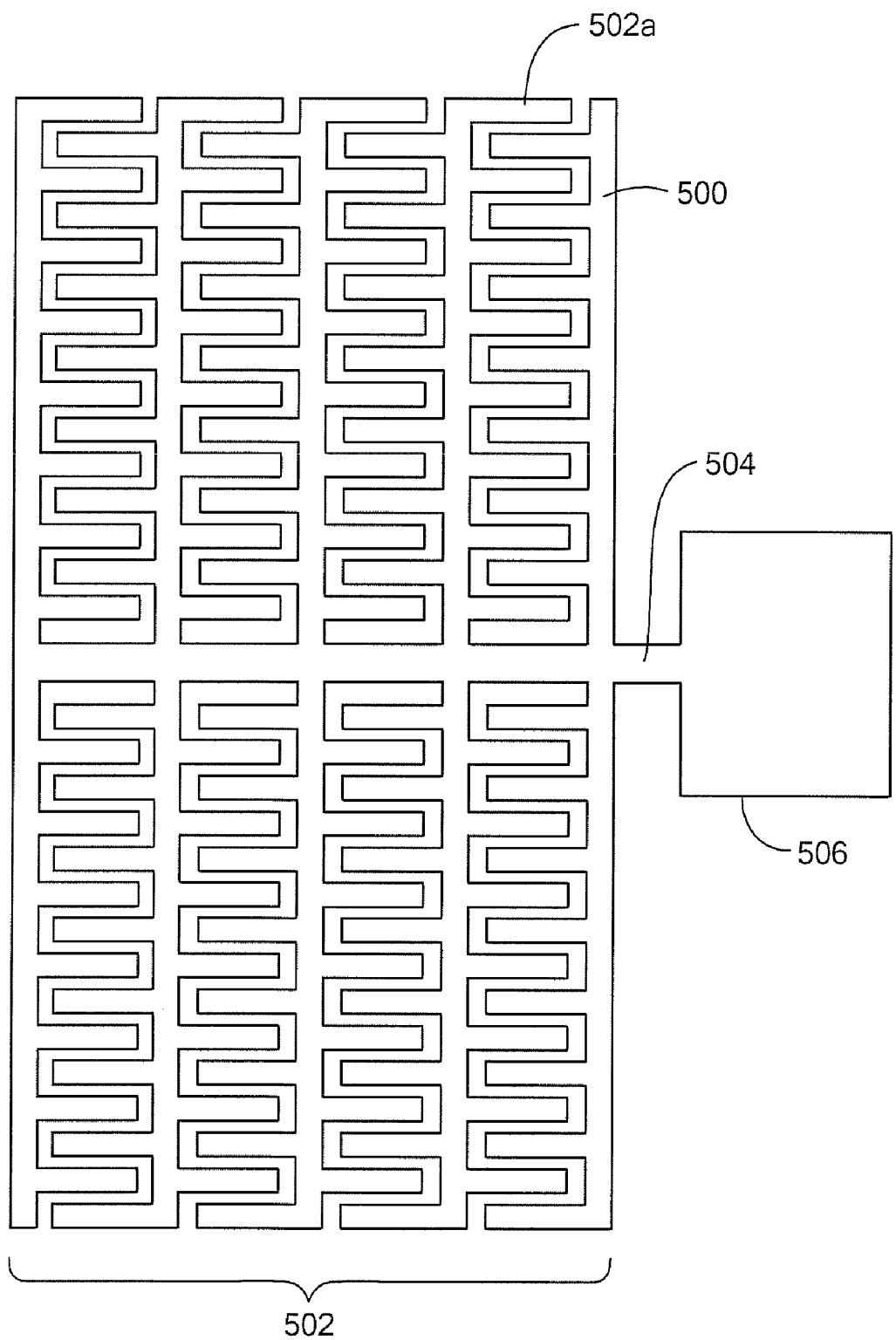
FIG. 11 is a top view of yet another electromagnetic shield that can form part of a current sensor.

Referring now to FIG. 11, an electromagnetic shield 500 includes a shielding portion 502 having interdigitated members, of which member 502a is but one example. The interdigitated members are coupled though a conductor portion 504 to a bonding pad 506, which allows the electromagnetic shield 500 to be coupled to a DC voltage, for example, a ground voltage.

It will be recognized that the electromagnetic shield 500 is able to support eddy currents having a much smaller size (i.e., diameter of path length) than the electromagnetic shield 450 of FIG. 10 or the electromagnetic shield 400 of FIG. 9. Therefore, the electromagnetic shield 500 tends to have an even smaller negative affect on sensitivity of a current sensor than that described above.

Figure 12:
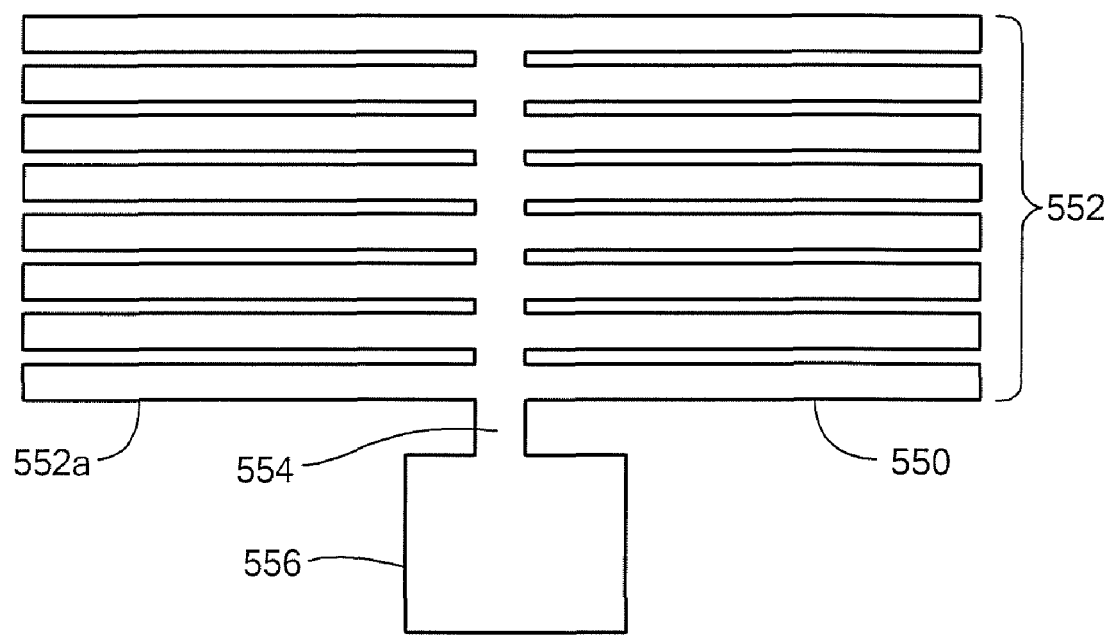
FIG. 12 is a top view of yet another electromagnetic shield that can form part of a current sensor.

Referring now to FIG. 12, an electromagnetic shield 550 includes a shielding portion 552 having a plurality of members, of which member 552a is but one example. The members are coupled though a conductor portion 554 to a bonding pad 556, which allows the electromagnetic shield 550 to be coupled to a DC voltage, for example, a ground voltage.

Advantages of the electromagnetic shield 550 will be apparent from discussion above.

Figure 13:
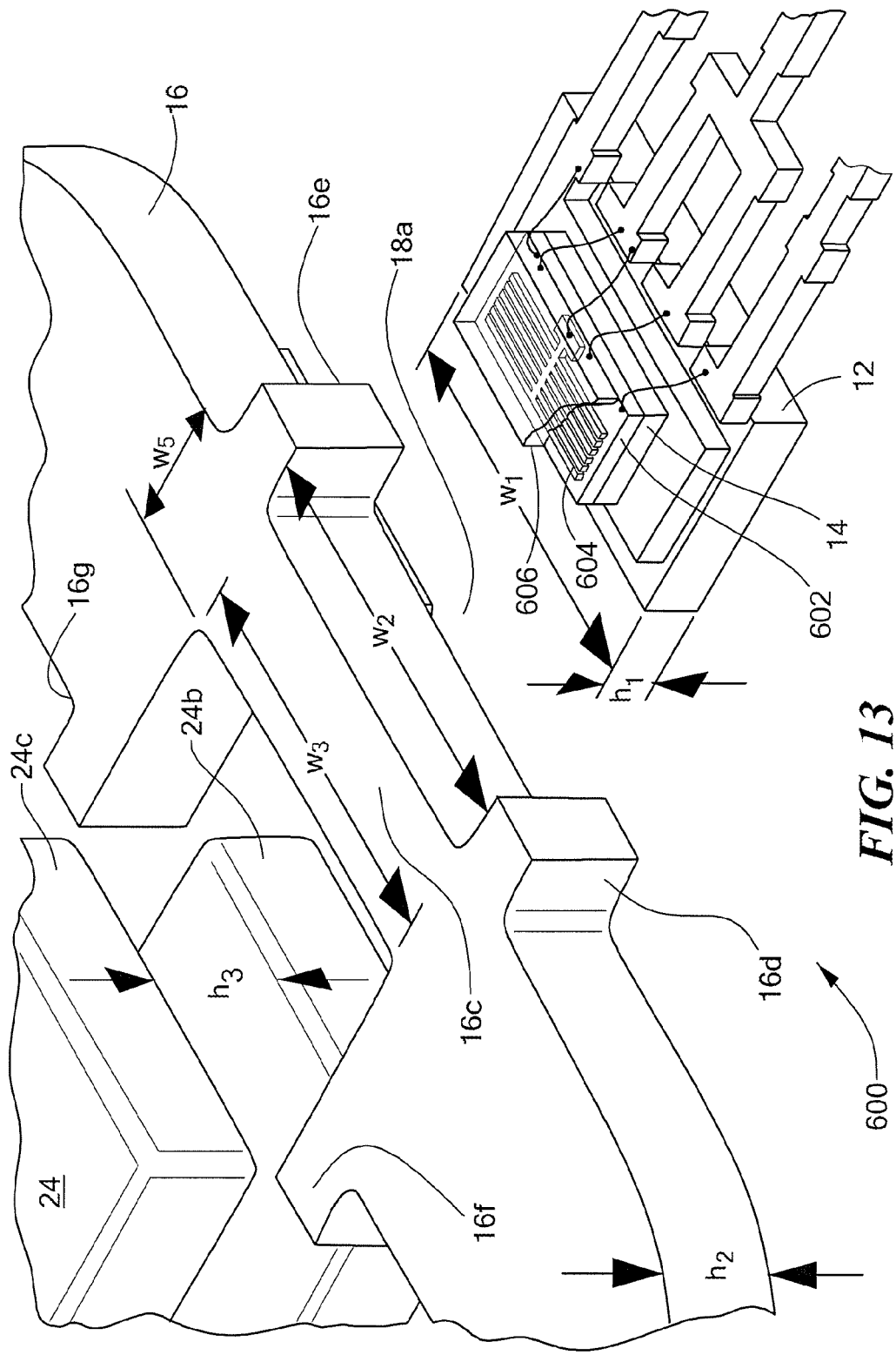
FIG. 13 an exploded isometric view of another current sensor in accordance with the present invention, having the electromagnetic shield of FIG. 9, 10, 11, or 12.

Referring now to FIG. 13, an integrated current sensor 600, in which like elements of FIG. 1 are shown having like reference designations, includes an insulating layer 602 disposed upon the top surface of the sensor die 14 (i.e., substrate). In some arrangements described below, the insulating layer 602 can be, for example, an interlayer dielectric layer (IDL) formed during normal processing of the sensor die 14.

The integrated current sensor 600 also includes an electromagnetic shield 604 disposed upon a top surface of the insulting layer 602. The electromagnetic shield 604 can have electrical and mechanical characteristics the same as or similar to any of the shields 400, 450, 500, 550 of FIG. 9-12, respectively. In some arrangements described below, the electromagnetic shield 604, can be, for example, a metal layer formed during an integrated circuit manufacturing process.

In some arrangements, another insulating layer 606 can be disposed upon a top surface of the electromagnetic shield 604. The insulating layer 606 can provide an improved breakdown voltage between the current conductor 16 and the sensor die 14 or between the magnetic core 24 and the sensor die 14. In some arrangements described below, the insulating layer 606, can be, for example, a passivation layer formed during an integrated circuit manufacturing process.

The electromagnetic shield 604 and the surrounding insulating layers 602, 606 can be formed in a variety of ways. For example, as described above, the insulating layer 602 can be a an interlayer dielectric layer (IDL), the electromagnetic shield 604 can be a metal layer, and the insulating layer 606 can be a passivation layer, all formed during a normal manufacturing process flow of the sensor die 14. A passivation layer will be recognized to generally be an outmost layer of an integrated circuit die, and is often comprised of a nitride material, an oxide material, or the like, which is formed in order to protect the integrated circuit die from the environment. For another example, the insulating layer 602 can be a passivation layer formed during a normal manufacturing process flow of the sensor die 14, wherein, thereafter, the electromagnetic shield 604 can be metal deposited by a separate process, followed by the insulating layer 606, which can be deposited by a separate process. For yet another example, the insulating layer 602 can be a passivation layer formed during a normal manufacturing process flow of the sensor die 14, wherein, thereafter, the electromagnetic shield 604 can be placed as a separate mechanical part (and coupled to ground with a wire bond or the like), and the insulating layer 606 can be placed as another separate mechanical part, for example, polymer tape. It should, however, be recognized that the last two of the above arrangements can have no outer insulating layer 606, since they already have a passivation layer 602 to protect the sensor die 14, in which case the electromagnetic shield 604 would be disposed upon the insulating layer 602 and over-molded with plastic or the like.

As described above for the magnetic field transducer 12 of FIG. 1B, the magnetic field transducer 12 can be provided in the form of an integrated circuit containing the sensor die 14 encapsulated with an electrically insulating material (not shown, see, e.g., encapsulation 30, FIG. 1B). The magnetic field transducer 12 can be provided in different package types, such as the "K" single in line (SIP) package having a thickness on the order of 1.0 mm or 1.6 mm.

In operation, the electromagnetic shield 604 tends to have at least two beneficial effects. First, the electromagnetic shield 604 shields the sensor die 14 from electromagnetic fields, which could cause noise in the integrated current sensor 600. One source of the electromagnetic noise comes from electrical noise in a signal carried in the current conductor 16. Having the eddy current reducing features described in conjunction with FIGS. 9-12, the electromagnetic shield 604 tends to have a reduced effect upon sensitivity of the magnetic field transducer 12 to an AC magnetic field, or transient magnetic field.

In addition, the electromagnetic shield 604, when grounded or coupled to a voltage source, tends to remove or reduce the effect of trapped charge generated on the surface of the sensor die 14, and, in particular, trapped charge that forms at an interface between the passivation layer (602 or 604 depending upon manufacturing method described above) and the above-described encapsulation (e.g., 30, FIG. 1B). The trapped charge tends to cause undesirable effects, for example "gate leakage" from the sensor die 14, which can result in out-of-specification behavior of the magnetic field transducer 12. The "gate leakage" can be caused by a forward biased enhancement mode parasitic field effect transistor (FET), which forms due to accumulated charge over a floating epi-material pocket in the sensor die 14. The gate leakage can result in threshold voltage shifts in the parasitic FET.

While the current sensor 600 is shown having the first and second notches 18a, 18b, respectively (also referred to herein as narrowed regions), in the current-carrying conductor 16, it will be apparent that, in other embodiments, the current sensor 600 can have but one of the notches 18a or 18b, or no notches. An embodiment having no notches is described below in conjunction with FIG. 14.

Furthermore, while the current-carrying conductor 16 is shown to be adjacent to an end of the magnetic field transducer 12 and an associated end of the sensor die 14, in other embodiments, the magnetic field transducer 12 and sensor die 14 can be disposed under the current carrying conductor 16, so that the current-carrying conductor 16 is proximate to a major surface of the sensor die 14. The type of magnetic field sensing element (14b, FIG. 1B) (e.g., Hall element, magnetoresistance element, etc.) upon the sensor die 14 can be selected based upon a direction of sensitivity of the magnetic field sensing element relative to a direction of the magnetic field passing through the magnetic field sensing element resulting from a current passing through the current conductor.

Figure 14:
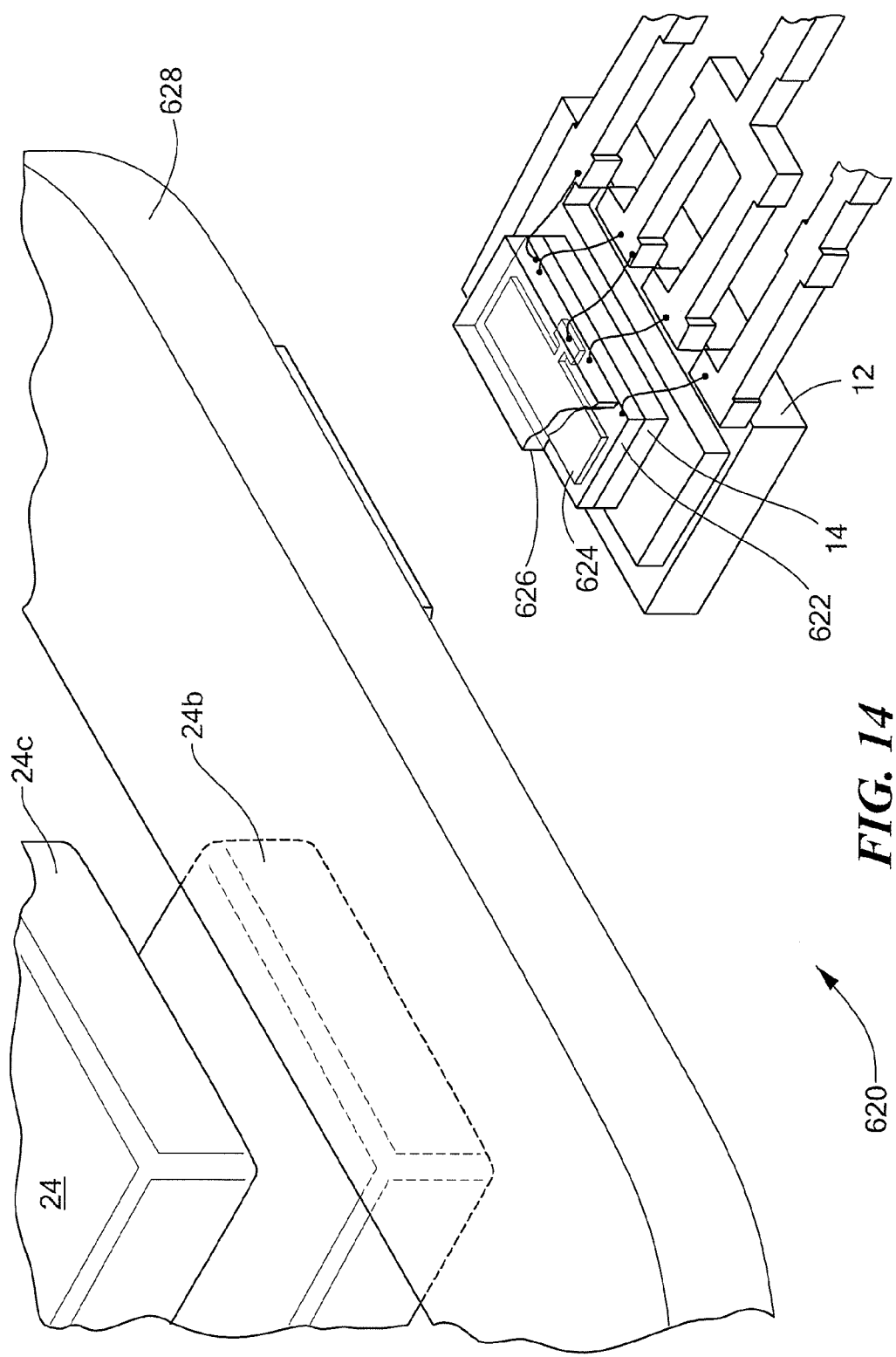
FIG. 14 an exploded isometric view of another current sensor in accordance with the present invention, having another electromagnetic shield.

Referring now to FIG. 14, an integrated current sensor 620, in which like elements of FIG. 1 are shown having like reference designations, includes a current conductor 628 without the narrowed region 16*c* having the notches 18*a*, 18*b* of FIGS. 1 and 13. The current conductor 620 can be the same as or similar to the current conductor 302 of FIG. 8A, and can include tabs such as tabs 16*a*, 16*b* (not shown) of FIG. 1.

In other arrangements, the current conductor 628 is the same as or similar to the current conductor 16 of FIGS. 1 and 13, which includes the narrowed region 16*c* and notches 18*a*, 18*b*. In still other arrangements, the current conductor 628 can have but one notch, e.g., notch 18*a* or 18*b* of FIG. 1.

The integrated current sensor 620 also includes an insulating layer 622 disposed upon the top surface of the sensor die 14 (i.e., substrate). In some arrangements described above in conjunction with the insulating layer 602 of FIG. 13, the insulating layer 622 can be, for example, an interlayer dielectric layer (IDL) formed during normal processing of the sensor die 14.

The integrated current sensor 620 also includes an electromagnetic shield 624 disposed upon a top surface of the insulting layer 602. The electromagnetic shield 624 has no eddy current reducing features and is substantially rectangular with no slits. However, in other arrangements, the electromagnetic shield 624 can have electrical and mechanical characteristics the same as or similar to any of the shields 400, 450, 500, 550 of FIG. 9-12, respectively. In some arrangements described above in conjunction with the electromagnetic shield 604 of FIG. 13, the electromagnetic shield 624, can be, for example, a metal layer formed during an integrated circuit manufacturing process.

In some arrangements, another insulating layer 626 can be disposed upon a top surface of the electromagnetic shield 624. The insulating layer 626 can provide an improved breakdown voltage between the current conductor 628 and the sensor die 14 or between the magnetic core 24 and the sensor die 14. In some arrangements described below, the insulating layer 626, can be, for example, a passivation layer formed during an integrated circuit manufacturing process.

Other fabrication methods of the integrated current sensor 620 will be understood form the discussion above in conjunction with FIG. 13.

It should be understood that when the integrated sensor 620 is assembled, the legs 24*b*, 24*c* of the magnetic core can straddle the current conductor 628 and/or the magnetic field transducer 12 (i.e., the magnetic field sensing element 14*a* (see, e.g., FIG. 1B) disposed upon the sensor die 14, in much the same way as described above in conjunction with FIG. 8A.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims. All references cited herein are hereby incorporated herein by reference in their entirety.

What is claimed is:

1. A current sensor, comprising:
   a current conductor for carrying a current sensed by the current sensor;
   a magnetic field transducer proximate to said current conductor, said magnetic field transducer comprising a sensor die with first and second opposing surfaces, the sensor die also having an end surface coupling the first and second opposing surfaces, wherein the first surface of the sensor die supports a magnetic field sensing element; and
   an electromagnetic shield proximate to the first surface of the sensor die , wherein said electromagnetic shield comprises at least one feature having a shape and a position selected to reduce an eddy current induced in said electromagnetic shield, wherein said at least one feature comprises a slot through the electromagnetic shield, wherein the slot is free of conductive material.

2. The current sensor of claim 1, wherein said current conductor is closer to the first surface of the sensor die than to the second surface of the sensor die.

3. The current sensor of claim 1, wherein said current conductor is closer to the end surface of the sensor die than to the first or second surfaces of the sensor die.

4. The current sensor of claim 1, wherein said electromagnetic shield is substantially planar and has a shape selected to reduce a path length of a closed loop current path in said electromagnetic shield.

5. The current sensor of claim 1, wherein said at least one feature comprises the slot having a longitudinal axis disposed in a plane parallel to the first surface of the sensor die.

6. The current sensor of claim 1, wherein said electromagnetic shield comprises:
   a central member; and
   a plurality of non-overlapping members coupled to the central member.

7. The current sensor of claim 1, wherein said electromagnetic shield comprises a plurality of interdigitated members.

8. The current sensor of claim 1, wherein a position of the at least one feature relative to said magnetic field transducer is selected to reduce an effect of the eddy current upon the magnetic field transducer.

9. The current sensor of claim 1, further comprising an insulating layer disposed between the first surface of the sensor die and said electromagnetic shield.

10. The current sensor of claim 1, further comprising an insulating layer disposed at a position resulting in said electromagnetic shield being between said insulating layer and the sensor die.

11. The current sensor of claim 1, further comprising at least one amplifier disposed on the sensor die.

12. The current sensor of claim 1, wherein said current conductor has a first notch and a second notch substantially aligned with the first notch, wherein said magnetic field transducer has at least a portion disposed in the first notch, wherein the current sensor further includes a magnetic core having a central region and a pair of substantially parallel legs extending from the central region, wherein at least a portion of the central region is disposed in the second notch and wherein at least a portion of each leg covers at least a portion of a respective surface of the magnetic field sensing element.

13. The current sensor of claim 12, wherein the magnetic field sensing element comprises a Hall effect element.

14. The current sensor of claim 12, wherein the magnetic field sensing element comprises a magnetoresistance element.

15. The current sensor of claim 12, wherein a width of the portion of said magnetic field transducer disposed in the first notch is substantially equal to the width of the first notch so that said magnetic field transducer is in a substantially fixed position with respect to said current conductor.

16. The current sensor of claim 12, wherein the width of the central region of said magnetic core disposed in the second notch is substantially equal to the width of the second notch so that said magnetic core is in a substantially fixed position with respect to said current conductor.

17. The current sensor of claim 12, wherein each of the legs of said magnetic core covers substantially an entire surface of said magnetic field transducer.

18. The current sensor of claim 12, wherein the first and second notches are located in a central region of said current conductor and said current conductor comprises a mounting mechanism at end regions thereof.

19. The current sensor of claim 12, wherein said magnetic core is comprised of a material selected from the group consisting of ferrite, steel, iron, iron alloy, nickel, cobalt, and permalloy.

20. The current sensor of claim 12, further comprising a molded body encapsulating at least a portion of said magnetic field transducer, said current conductor, and said magnetic core.

21. The current sensor of claim 12, wherein the pair of substantially parallel legs are spaced by a distance substantially equal to a thickness of said magnetic field transducer.

22. The current sensor of claim 1, wherein said current conductor has a narrowed region, a tab, and an intermediate region extending from the narrowed region to the tab, wherein the narrowed region has opposing, substantially planar surfaces, wherein the intermediate region has opposing, substantially planar surfaces, wherein the opposing, substantially planar surfaces of the intermediate region are generally parallel to the opposing, substantially planar surfaces of the narrowed region, wherein the narrowed region comprises a notch in a first side of the narrowed region, wherein the tab is adapted to couple to a circuit board with the opposing, substantially planar surfaces of the narrowed region substantially parallel to the circuit board; and
   a magnetic core having a central region and a pair of substantially parallel legs extending from the central region, wherein a selected one of said magnetic field transducer or the central region of said magnetic core is disposed in the notch and wherein the other one of said magnetic field transducer or the central region of said magnetic core is adjacent to a second, opposite, side of the narrowed region so that the pair of legs straddles the opposing, substantially planar surfaces of the narrowed region with each leg covering at least a portion of a respective surface of the magnetic field sensing element.

23. The current sensor of claim 22, further comprising a molded body encapsulating at least a portion of said magnetic field transducer, said current conductor, and said magnetic core.

24. The current sensor of claim 22, wherein the magnetic field sensing element comprises a Hall effect element.

25. The current sensor of claim 22, wherein the magnetic field sensing element comprises a magnetoresistance element.

26. The current sensor of claim 22, wherein the tab is adapted to be inserted though a hole in a circuit board.

27. The current sensor of claim 26, wherein the tab comprises a plastically bent portion of said current conductor.

28. A current sensor, comprising:
   a current conductor for carrying a current sensed by the current sensor;
   a magnetic field transducer proximate to said current conductor, said magnetic field transducer comprising a sensor die with first and second opposing surfaces, the sensor die also having an end surface coupling the first and second opposing surfaces, wherein the first surface of the sensor die supports a magnetic field sensing element;
   an electromagnetic shield proximate to the first surface of the sensor die, wherein said electromagnetic shield comprises at least one feature having a shape and a position selected to reduce an eddy current induced in said electromagnetic shield, wherein said at least one feature comprises a slot through the electromagnetic shield, wherein the slot is free of conductive material; and
   a magnetic core having a central region and a pair of substantially parallel legs extending from the central region, wherein the pair of legs straddles the current conductor with at least a portion of each leg covering at least a portion of a respective surface of the magnetic field sensing element.

29. The current sensor of claim 28, wherein said current conductor is closer to the first surface of the sensor die than to the second surface of the sensor die.

30. The current sensor of claim 28, wherein said current conductor is closer to the end surface of the sensor die than to the first or second surfaces of the sensor die.

31. The current sensor of claim 28, wherein said current conductor has a first notch and a second notch substantially aligned with the first notch, wherein said magnetic field transducer has at least a portion disposed in the first notch, wherein at least a portion of the central region of the magnetic core is disposed in the second notch.

32. The current sensor of claim 31, wherein a width of the portion of said magnetic field transducer disposed in the first notch is substantially equal to a width of the first notch so that said magnetic field transducer is in a substantially fixed position with respect to said current conductor, and wherein a width of the central region of said magnetic core disposed in the second notch is substantially equal to a width of the second notch so that said magnetic core is in a substantially fixed position with respect to said current conductor.

33. The current sensor of claim 28, wherein said current conductor has a narrowed region, a tab, and an intermediate region extending from the narrowed region to the tab, wherein the narrowed region has opposing, substantially planar surfaces, wherein the intermediate region has opposing, substantially planar surfaces, wherein the opposing, substantially planar surfaces of the intermediate region are generally parallel to the opposing, substantially planar surfaces of the narrowed region, wherein the narrowed region comprises a notch in a first side of the narrowed region, wherein the tab is adapted to couple to a circuit board with the opposing, substantially planar surfaces of the narrowed region substantially parallel to the circuit board, wherein a selected one of said magnetic field transducer or the central region of said magnetic core is disposed in the notch and wherein the other one of said magnetic field transducer or the central region of said magnetic core is adjacent to a second, opposite, side of the narrowed region so that the pair of legs straddles the opposing, substantially planar surfaces of the narrowed region.

34. The current sensor of claim 33, wherein a width of the selected one of said magnetic field transducer or the central region of said magnetic core disposed in the notch is substantially equal to a width of the first notch so that the selected one of said magnetic field transducer or the central region of said magnetic core is in a substantially fixed position with respect to said current conductor.

35. The current sensor of claim 28, further including first and second insulating layers, wherein said electromagnetic shield is disposed between the first and second insulating layers.

36. The current sensor of claim 28, wherein said at least one feature comprises the slot having a longitudinal axis disposed in a plane parallel to the first surface of the sensor.

\* \* \* \* \*

UNITED STATES PATENT AND TRADEMARK OFFICE
CERTIFICATE OF CORRECTION

PATENT NO. : 8,080,994 B2  
APPLICATION NO. : 12/261629  
DATED : December 20, 2011  
INVENTOR(S) : William P. Taylor et al.

It is certified that error appears in the above-identified patent and that said Letters Patent is hereby corrected as shown below:

Column 3, line 18 delete "FIG." and replace with --FIGS.--.

Column 3, line 19 delete "an" and replace with --is an--.

Column 3, lines 25-26 delete "of Hall" and replace with --of a--.

Column 5, line 51 delete "order 1.7mm" and replace with --order of 1.7mm--.

Column 7, line 25 delete "regions" and replace with --region--.

Column 9, line 9 delete "sensor of" and replace with --sensor 10 of--.

Column 12, line 14 delete "current" and replace with --currents--.

Column 12, line 60 delete "loops" and replace with --loop--.

Column 13, line 15 delete "though" and replace with --through--.

Column 13, line 29 delete "though" and replace with --through--.

Column 13, lines 42-43 delete "insulting" and replace with --insulating--.

Column 13, line 45 delete "FIG." and replace with --FIGS.--.

Column 13, line 60 delete "a an" and replace with --an--.

Column 14, line 43 delete "upon" and replace with --upon the--.

Column 15, lines 29-30 delete "insulting" and replace with --insulating--.

Signed and Sealed this  
Twenty-sixth Day of June, 2012

David J. Kappos  
*Director of the United States Patent and Trademark Office*

CERTIFICATE OF CORRECTION (continued)
U.S. Pat. No. 8,080,994 B2

Column 15, line 35 delete "FIG." and replace with --FIGS.--.

Column 17, line 65 delete "though" and replace with --through--.